US012615836B2

(12) United States Patent
Gogoi et al.

(10) Patent No.: US 12,615,836 B2
(45) Date of Patent: Apr. 28, 2026

(54) TRENCH FIELD EFFECT TRANSISTOR HAVING IMPROVED ELECTRICAL PERFORMANCE

(71) Applicant: ThinSiC Inc, Santa Clara, CA (US)

(72) Inventors: Bishnu Prasanna Gogoi, Scottsdale, AZ (US); Jinho Seo, Saratoga, CA (US)

(73) Assignee: ThinSiC Inc., Santa Clara, CA (US)

( * ) Notice: Subject to any disclaimer, the term of this patent is extended or adjusted under 35 U.S.C. 154(b) by 408 days.

(21) Appl. No.: 18/081,391

(22) Filed: Dec. 14, 2022

(65) Prior Publication Data

US 2024/0204071 A1     Jun. 20, 2024

(51) Int. Cl.
| | |
|---|---|
| *H10D 64/27* | (2025.01) |
| *H10D 30/01* | (2025.01) |
| *H10D 30/63* | (2025.01) |
| *H10D 62/13* | (2025.01) |
| *H10D 62/832* | (2025.01) |

(52) U.S. Cl.
CPC ......... *H10D 64/513* (2025.01); *H10D 30/025* (2025.01); *H10D 30/63* (2025.01); *H10D 62/151* (2025.01); *H10D 62/8325* (2025.01)

(58) Field of Classification Search
CPC .... H10D 64/513; H10D 30/025; H10D 30/63; H10D 62/151; H10D 62/8325; H10D 64/516
USPC ....................................... 257/330
See application file for complete search history.

(56) References Cited

U.S. PATENT DOCUMENTS

| | | | |
|---|---|---|---|
| 5,614,749 | A | 3/1997 | Ueno |
| 5,693,569 | A | 12/1997 | Ueno |
| 5,895,939 | A | 4/1999 | Ueno |
| 5,963,807 | A | 10/1999 | Ueno |
| 7,033,892 | B2 | 4/2006 | Hsu et al. |
| 8,575,622 | B2 | 11/2013 | Nakano |
| 9,024,329 | B2 | 5/2015 | Nakano |
| 9,466,709 | B2 | 10/2016 | Konstantinov |
| 9,893,176 | B2 | 2/2018 | Konstantinov |
| 10,355,123 | B2 | 7/2019 | Konstantinov |
| 10,777,689 | B1 | 9/2020 | Yau et al. |
| 11,462,638 | B2 | 10/2022 | Hsieh |
| 2010/0044792 | A1* | 2/2010 | Hebert ................. H10D 30/668 257/341 |
| 2012/0248531 | A1* | 10/2012 | Miyata ................. H10D 64/519 257/334 |
| 2014/0225126 | A1* | 8/2014 | Aketa ................... H10D 62/142 257/77 |

(Continued)

*Primary Examiner* — Mohammad M Hoque

(57)     ABSTRACT

A trench field effect transistor comprising a substrate. An epitaxial buffer layer is formed overlying the substrate. An epitaxial device layer is formed overlying the epitaxial buffer layer. A device body layer is formed overlying the epitaxial device layer. The substrate, epitaxial buffer layer, epitaxial device layer, and device body layer comprise silicon carbide. A trench formed in the device body layer into at least a portion of the epitaxial body layer. An insulating layer formed on the walls of the trench. A bottom of the trench is etched isotropically and forms a curved surface. The trench bottom after the isotropic etch extends past the walls of the trench and couples to the trench walls in a curve. An oxide layer is formed overlying the trench bottom and has a corresponding curve similar to the trench bottom. A gate oxide is formed on at least one wall of the trench.

20 Claims, 22 Drawing Sheets

(56)  References Cited

U.S. PATENT DOCUMENTS

| | | | |
|---|---|---|---|
| 2014/0339630 A1* | 11/2014 | Yilmaz ................ | H10D 62/127 |
| | | | 257/334 |
| 2015/0279946 A1* | 10/2015 | Henson ................ | H10D 30/668 |
| | | | 438/270 |
| 2016/0276497 A1* | 9/2016 | Mizukami ................ | H10D 8/50 |
| 2016/0300943 A1* | 10/2016 | Hiyoshi ............... | H10D 62/127 |
| 2020/0083369 A1* | 3/2020 | Kobayashi ........... | H10D 64/256 |
| 2021/0134960 A1 | 5/2021 | Siemieniec et al. | |
| 2021/0217663 A1* | 7/2021 | Nähle ................... | H01L 21/268 |
| 2021/0242319 A1 | 8/2021 | Sheridan et al. | |
| 2022/0085186 A1 | 3/2022 | Siemieniec et al. | |
| 2022/0190114 A1 | 6/2022 | Tawara et al. | |
| 2022/0367710 A1 | 11/2022 | Hsieh | |

* cited by examiner

100

200

100

TRENCH FIELD EFFECT TRANSISTOR HAVING IMPROVED ELECTRICAL PERFORMANCE

FIELD

This invention relates to semiconductor device manufacture, and in particular to methods of forming a trench field effect transistor.

BACKGROUND

The use of wide bandgap (WBG) semiconductors has increased dramatically in recent years in power electronics. Their ability to operate efficiently at higher voltages, powers, temperatures, and switching frequencies has enabled reduced cooling requirements, lower part counts, and the use of smaller passive components. WBG-based power electronics can further reduce the footprint and potentially the system cost of various renewable energy electrical equipment such as motor drivers and inverters.

Among the WBG semiconductors for power electronics, Silicon Carbide (SIC) has now been increasingly used for high voltage drivers (>1200V) whereas Gallium Nitride (GaN) has been experiencing increased use in both higher power and higher frequency applications. From the substrate standpoint, 4H-Silicon carbide (SiC) Single Crystal Substrates have been used for both SiC and GaN devices since SiC and GaN epitaxial layers can be grown with reduced defects on SiC substrates. The GaN substrate, on the other hand, is very expensive to grow defect free and has not kept up with scaling size increases afforded with SiC substrates. While the SiC substrate quality has dramatically improved in the recent years, the cost has not come down since substrate fabrication is a complex process starting with vapor phase ingot growth followed by ingot cropping, then wire sawing of individual wafers, and finally grinding and polishing of the substrate, and as of now, there has been no proven practical method to eliminate any of these foregoing steps.

As a semiconductor substrate for WBG semiconductors is being produced and devices that use high currents are fabricated, defects play a larger role and are magnified because die sizes are larger and any defect will contribute to more significant yield loss and potential lower reliability. Therefore, to maximize die yield, any cost reduction activity regarding the substrate and the device is paramount. Similarly, improving the electrical characteristics of the device formed on the substrate in conjunction with lowering fabrication costs will support integration into systems where they were not considered due to cost or performance. Furthermore, improving reliability of the device can be an essential component in utilizing a device where safety or critical operation is concerned. Improving device performance such as high frequency operation or increased voltage operation can also be a factor.

Accordingly, it is desirable to provide a system that lowers wafer processing costs while improving device performance to enable new uses for high power high efficiency semiconductor devices.

BRIEF DESCRIPTION OF THE DRAWINGS

Various features of the system are set forth with particularity in the appended claims. The embodiments herein, can be understood by reference to the following description, taken in conjunction with the accompanying drawings, in which:

DETAILED DESCRIPTION

Figures 1, 2:
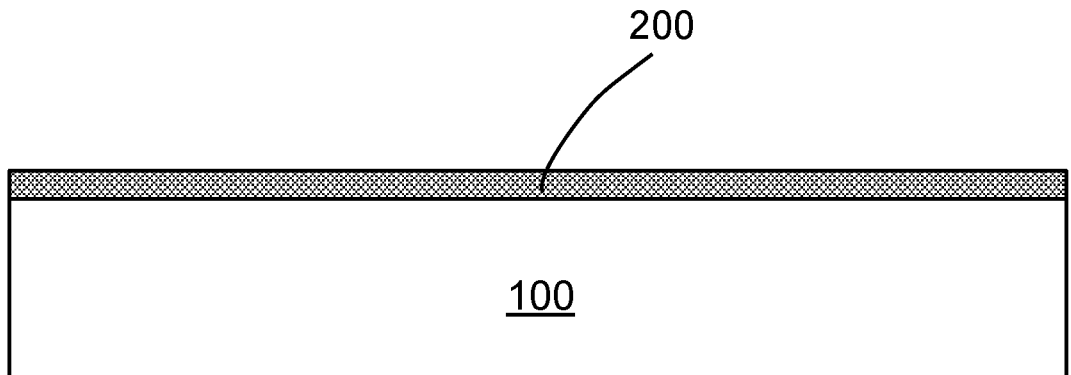
FIG. 1 is an illustration of a substrate in accordance with an example embodiment.
FIG. 2 is an illustration of a hard mask layer over the substrate in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

The current invention is described with an example embodiment of a silicon carbide MOSFET (Metal Oxide Semiconductor Field Effect Transistor) using a silicon carbide substrate as the starting substrate. In the example embodiment, the example embodiment of the MOSFET is a Trench MOSFET or Trench FET (Field Effect Transistor) since trenches or recesses are formed in the silicon carbide substrate to provide higher performance in the operation of the semiconductor device.

FIG. 1 is an illustration of a substrate 100 in accordance with an example embodiment. Substrate 100 is used as a starting material for the fabrication of the Trench MOSFET. In one embodiment substrate 100 is a crystalline 4H silicon carbide wafer with a preferred crystalline orientation of <0001> with an offcut towards <1120> of 4 degrees. In one embodiment, a thickness of substrate 100 is in the range of 300-400 microns. In one embodiment, substrate 100 may be a single polished or double polished wafer. In one embodiment, substrate 100 is the basic platform on which the example embodiment is implemented to support the process flow in accordance with the current invention. While silicon carbide substrate is used in an example embodiment, the invention can be implemented using other semiconductor substrates such as gallium nitride, gallium arsenide, indium phosphide, silicon, silicon on insulator (SOI) among others.

FIG. 2 is an illustration of a hard mask layer 200 overlying substrate 100 in accordance with an example embodiment. Hard mask layer 200 is deposited over the surface of substrate 100. Hard mask layer 200 is deposited using techniques such as CVD (Chemical Vapor Deposition), LPCVD (low pressure chemical vapor deposition), PECVD (Plasma Enhanced Chemical Vapor Deposition), APCVD (Atmospheric Pressure Chemical Vapor Deposition), and SACVD (Sub Atmospheric Chemical Vapor Deposition) among other techniques. PVD (Physical Vapor Deposition), or ALD (Atomic layer Deposition) may also be used for hard mask layer 200. In the example implementation, hard mask layer 200 is composed of PECVD (Plasma Enhanced Chemical Vapor Deposition) silicon oxide. The thickness of silicon oxide hard mask layer 200 is selected based on the requirements of subsequent processing steps as described in the example implementation and is in the range of 100-3000 nm. The thickness of hard mask layer 200 is determined by the specific requirements of the implementation and is well known to those skilled in the art.

Figure 3:
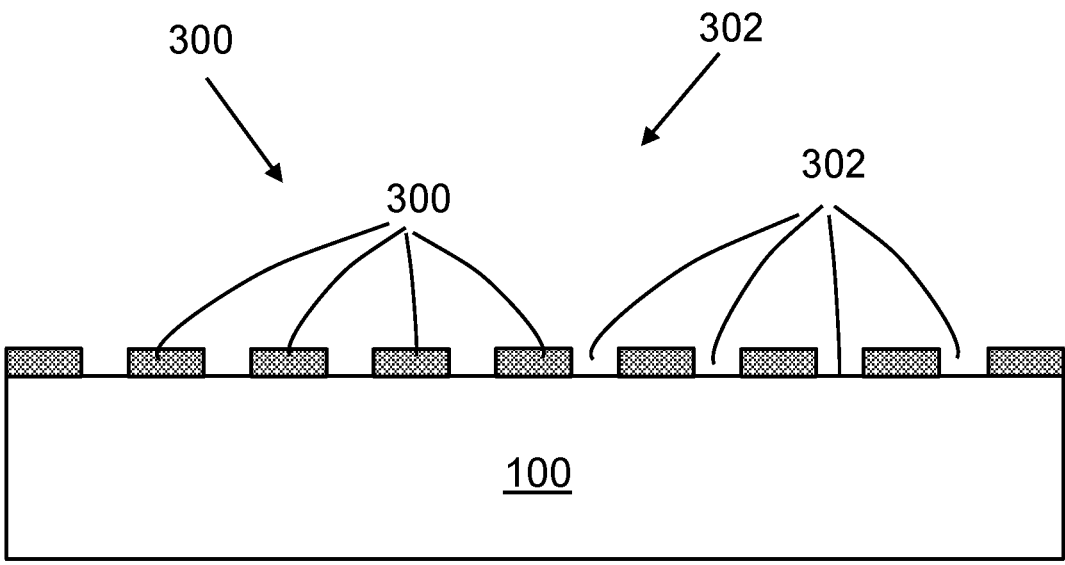
FIG. 3 is an illustration of a plurality of openings formed in the hard mask layer in accordance with an example embodiment.

FIG. 3 is an illustration of a plurality of openings 302 formed in hard mask layer 200 of FIG. 2 in accordance with an example embodiment. In one embodiment, the process steps disclosed herein below will lead to the formation of a Trench MOSFET device in substrate 100. In one embodiment, hard mask layer 200 of FIG. 2 is deposited overlying the surface of substrate 100 and is patterned to subsequently support the formation of plurality of openings 302 to expose the surface of substrate 100 in the plurality of openings 302. A remaining patterned hard mask 300 remains after the patterning process. Plurality of openings 302 are formed in hard mask layer 200 by using methods of lithography and etching techniques commonly used in the semiconductor industry. In one embodiment, remaining patterned hard mask 300 is left in areas to protect substrate 100 from being etched. The shape of plurality of openings 302 are determined by the requirements of epitaxial growth in subsequent steps in the implementation of the example embodiment. In one embodiment, plurality of openings 302 may be in the shape of squares or rectangles. In another embodiment, plurality of openings 302 may be in the shape of triangles, hexagons or diamonds. In another embodiment, plurality of openings 302 may be in the shape of stripes which may be horizontal, vertical, or sloped at an angle. The size of plurality of openings 302 may be in the range of (20-500) nm and determined by the requirements of epitaxial overgrowth in the subsequent steps of fabrication of the example device. In one embodiment, spacing between adjacent openings of plurality of openings 302 is determined by the requirements of epitaxial overgrowth in the subsequent steps of fabrication of the example device and can be in the range of 500 nm to 5 micrometers. Plurality of openings 302 are generated on a surface of hard mask layer 200 of FIG. 2 by using lithography techniques that are well known to those skilled in the art. In one embodiment, plurality of openings 302 are implemented using optical lithography using UV, DUV or EUV. In another embodiment, plurality of openings 302 are implemented using an electron beam direct write technique. In yet another embodiment, plurality of openings 302 are implemented using Nano-Imprint Lithography (NIL).

In one example embodiment, plurality of openings 302 are implemented by first coating a surface of hard mask layer 200 of FIG. 2 with a photosensitive layer of photoresist, which may be positive or negative in its chemistry. In the example embodiment, positive photoresist is used in coating the surface of hard mask layer 200. An optical tool called a stepper is used to transfer the pattern of openings on to the positive photoresist layer using chemistries that are well known to those skilled in the art. The choice of the photo-resist layer, thickness of the photoresist layer, the exposure and develop times for the subsequent chemical steps are well known to those skilled in the art and determined by the requirements of accurate pattern transfer from the photore-sist layer to hard mask layer 200 to subsequently form plurality of openings 302. The stepper transfers the pattern of plurality of openings 302 to cover the surface of hard mask layer 200 overlying substrate 100.

After the pattern transfer is completed using lithography, the next step is the patterning of hard mask layer 200 using etching techniques to selectively remove the hard mask layer 200 of FIG. 2 overlying substrate 100 thereby leaving patterned hard mask 300 overlying substrate 100. The selec-tive removal of hard mask layer 200 to form patterned hard mask 300 may use Reactive Ion Etching (RIE). Different gases may be used to form a plasma to selectively remove the portions of hard mask layer 200 exposed by the patterned photoresist. The choice of gases for the RIE is determined by hard mask layer 200 used in the implementation. In the example embodiment, with a silicon oxide used as hard mask layer 200, fluorine-based chemistries such as $SF_6$, $CF_4$, $CHF_3$, and other gases may be used in the RIE. Accordingly, in the example embodiment with silicon oxide as hard mask layer 200, plurality of openings 302 are etched in hard mask layer 200 of FIG. 2 using a fluorine-based chemistry that exposes the surface of substrate 100 in plurality of openings 302. In the example embodiment, substrate 100 comprises silicon carbide. Patterned hard mask 300 remains in areas overlying the surface of substrate 100 to protect or mask the surface of substrate 100 from etching. After patterning hard mask layer 200, the photore-sist is stripped using techniques well known to those skilled in the art and may be dry, wet or a combination of dry and wet processing.

Figure 4:
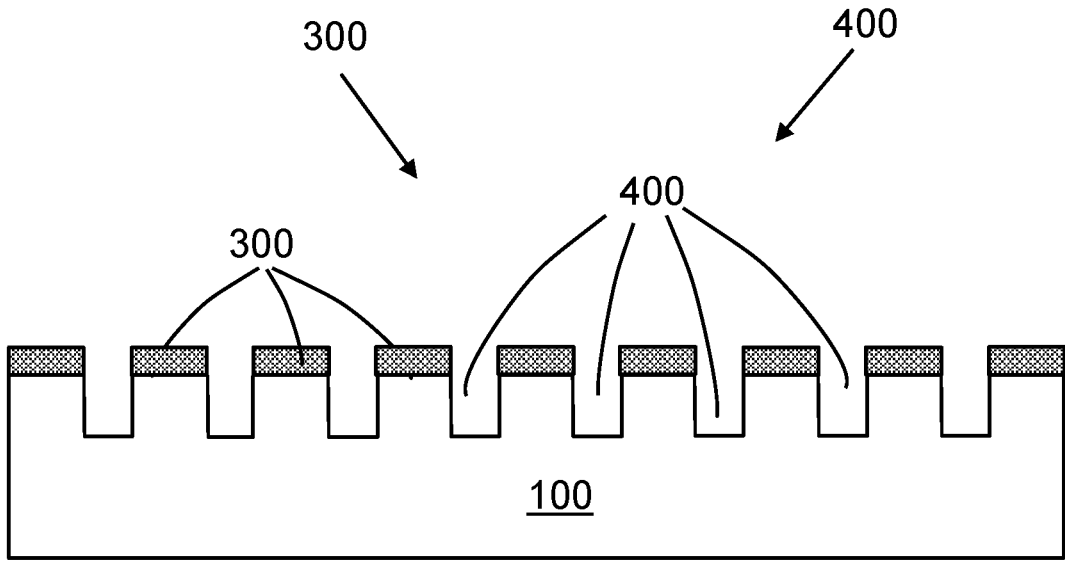
FIG. 4 is an illustration of a plurality of trenches formed in the substrate in accordance with an example embodiment.

FIG. 4 is an illustration of a plurality of trenches 400 formed in substrate 100 in accordance with an example embodiment. Plurality of trenches 400 are formed after hard mask layer 200 of FIG. 2 is etched to form plurality of openings 302 in FIG. 3. In one embodiment, the surface of substrate 100 exposed by plurality of openings 302 of FIG. 3 is then etched to form plurality of trenches 400 using RIE (Reactive Ion Etching). In one embodiment, substrate 100 is etched using patterned hard mask 300 as shown in FIG. 3 to form plurality of trenches 400 with an aspect ratio that is determined by the requirements of epitaxial growth in subsequent processing of the example device. Thus, plural-ity of openings 302 of FIG. 3 are etched below the surface of substrate 100 to form plurality of trenches 400. In the example, plurality of trenches 400 are formed in substrate 100 comprising silicon carbide. It should be noted that other substrates can be used similarly as disclosed herein above. In one embodiment, the depth of plurality of trenches 400 may be in the range of 500 nm to 3 micrometers. In one embodiment, an inductively coupled plasma (ICP) with high density may also be used to form plurality of trenches 400 in substrate 100.

Figure 5:
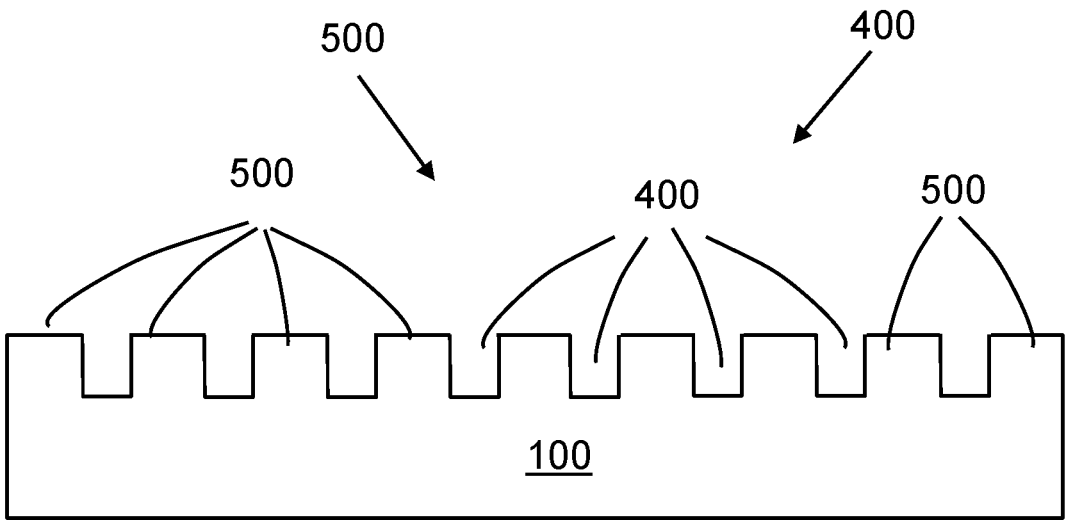
FIG. 5 is an illustration of plurality of trenches formed in the substrate after the removal of the patterned hard mask in accordance with an example embodiment.

FIG. 5 is an illustration of plurality of trenches 400 formed in substrate 100 in accordance with an example embodiment. Plurality of trenches 400 are shown after the removal of patterned hard mask 300 of FIG. 3. In an example embodiment, patterned hard mask 300 of FIG. 3 is forming plurality of regions 500 adjacent to plurality of trenches 400 in substrate 100. In one embodiment, patterned hard mask 300 is removed by using wet or dry chemical etching and is determined by the choice of hard mask layer material. In the example embodiment, patterned hard mask 300 comprises a PECVD silicon oxide that is removed using a wet chemistry of BHF (Buffered Hydrofluoric Acid). Other solutions for etching PECVD silicon oxide may include HF (Hydrofluoric Acid) in various dilutions in water. Substrate 100 is then cleaned in preparation for the next step in the fabrication of the example device. In one embodiment, the pattern of plurality of trenches 400 are shaped as triangles or hexagons to expose (1120) or equivalent crystal planes since these orientations facilitate high quality epitaxial over-growth with low defect density in subsequent processing steps in accordance with the current invention. In the example embodiment, a surface of plurality of trenches 400 is below a surface of plurality of regions 500.

Figure 6:
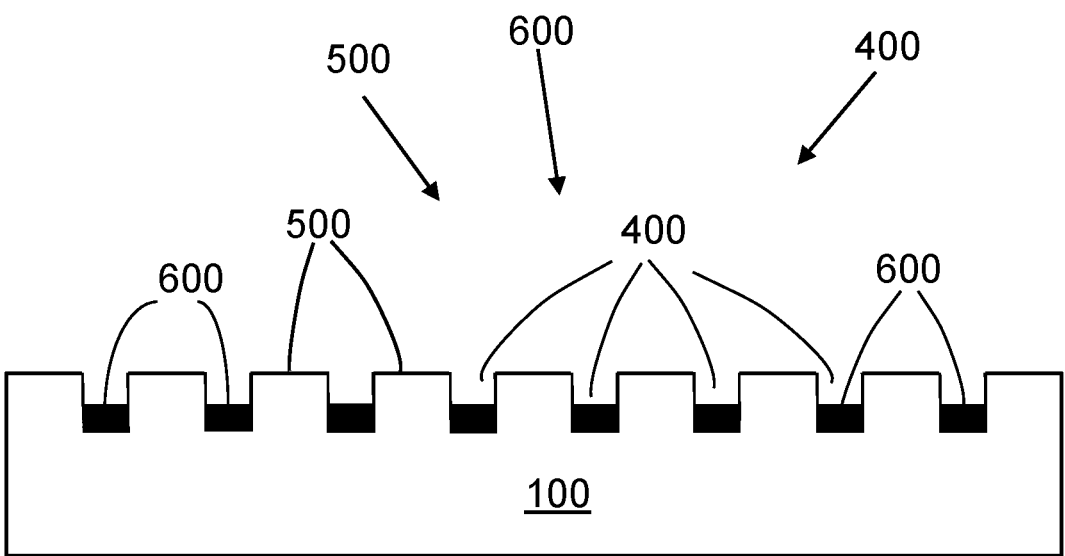
FIG. 6 is an illustration of a carbon layer formed in the plurality of trenches in accordance with an example embodiment.

FIG. 6 in an illustration of a carbon layer 600 formed in plurality of trenches 400 in accordance with an example embodiment. In one embodiment, carbon layer 600 is used in the epitaxial growth processes overlying substrate 100 as will be subsequently described herein below. Carbon layer 600 in plurality of trenches 400 can be formed using different processes. Thickness of carbon layer 600 formed in recessed portions of plurality of trenches 400 can be in the range of (100-1000) nm and is determined by the depth of plurality of trenches 400 and dimensions and shape of plurality of regions 500. In an example embodiment, a thickness of carbon layer 600 is 400 nm.

Carbon layer 600 can be formed in recessed portions of plurality of trenches 400 using different methods and pro-cesses. In one embodiment, carbon layer 600 may be formed by spin coating a polymer layer and then subsequently converting it into a carbon layer by pyrolysis in an inert environment. In another embodiment, carbon layer 600 may be formed by CVD (Chemical Vapor Deposition) of a polymer layer such as Parylene and subsequently converting the deposited polymer layer in carbon by heating it at a high temperature of (900-1400) ° C. in an inert environment such as nitrogen. In another embodiment, carbon layer 600 may be formed by sputter deposition using a carbon target. Other methods of carbon deposition may include CVD (chemical vapor deposition) to form carbon layer 600. Thickness of carbon layer 600 may be adjusted to the desired thickness using etching methods such as RIE (Reactive Ion Etching) using oxygen, argon and other gases, as well known to those skilled in the art.

In an example embodiment, carbon layer 600 is formed by spin coating a photoresist layer. The photoresist layer may be a positive polarity or negative photoresist. The choice of thickness of the photoresist layer is determined by the depth of plurality of trenches 400 and the final thickness of carbon layer 600 required by the process. The final thickness of the spin-coated photoresist is determined by the choice of the viscosity of the photoresist and the spread and spin speed during the dispense of the photoresist. The spin-coated photoresist is then baked in a nitrogen environment at a temperature of (90-120) ° ° C. to drive out solvents. In the pyrolysis process, substrate 100 having plurality of trenches 400 coated with a photoresist layer is placed in a furnace and heated to (900-1400) ° C. in an inert environment of nitrogen or in forming gas (nitrogen with hydrogen) to convert the spin-coated photoresist to carbon. During the pyrolysis process, the spin coated photoresist layer is converted into carbon while undergoing volumetric shrinkage. In the example embodiment, the pyrolysis process converts the spin-coated photoresist to carbon while also shrinking to form carbon layer 600 covering recessed portions of plurality of trenches 400. In another embodiment, the spin-coated photoresist layer thickness may be modified by etching in an oxygen plasma after the spin-coating and prior to the pyrolysis process. In another embodiment, a thickness of carbon layer 600 is reduced by etching pyrolyzed photoresist after the pyrolysis process.

Figure 7:
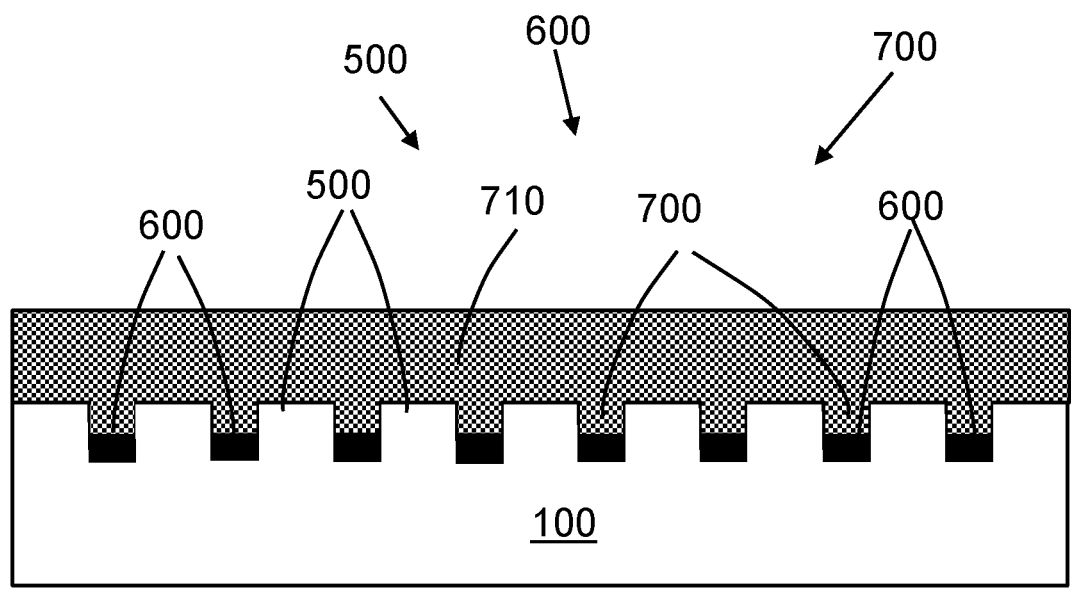
FIG. 7 is an illustration of an epitaxial buffer layer formed overlying the substrate in accordance with an example embodiment.

FIG. 7 in an illustration of an epitaxial buffer layer 710 formed overlying substrate 100 in accordance with an example embodiment. In one embodiment, epitaxial buffer layer 710 is a silicon carbide epitaxial layer formed overlying plurality of regions 500 and carbon layer 600 in plurality of trenches 400 of FIG. 6. In one embodiment, epitaxial buffer layer 710 may be a heavily doped N+ layer forming a buffer epitaxial layer overlying substrate 100, and more specifically plurality of regions 500 and carbon layer 600.

In an example embodiment, epitaxial buffer layer 710 is formed overlying substrate 100 with regions of carbon layer 600 formed in plurality of trenches 400 in a silicon carbide epitaxial reactor. As mentioned previously, in the example embodiment, substrate 100 comprises silicon carbide. In the epitaxial reactor, silicon carbide grows according to the crystalline orientation of exposed silicon carbide substrate. Silicon carbide will grow on or from the exposed underlying substrate 100 both vertically and laterally with portions of carbon layer 600 acting to inhibit the epitaxial growth with growth conditions that are well known to those skilled in the art. As shown in FIG. 6, the exposed surface for epitaxial growth comprises plurality of regions 500 (substrate 100) and carbon layer 600 in plurality of trenches 400. The silicon carbide epitaxial growth over exposed portions of substrate 100 and carbon layer 600 occurs both vertically from the surface of plurality of regions 500 as well as laterally from the sidewalls of pillars formed by plurality of regions 500 to form epitaxial buffer layer 710. By modulating the growth conditions in the epitaxial reactor, the lateral and vertical growth rates, the silicon carbide epitaxial layer can be grown to form epitaxial buffer layer 710 with low crystalline defect density.

In the epitaxial reactor, the lateral fronts of the epitaxial regions of silicon carbide epitaxial buffer layer 710 merge due to epitaxial lateral overgrowth (ELO) or merged epitaxial lateral overgrowth (MELO). The process of epitaxial crystal growth is used to form a single crystal layer of silicon carbide over regions of carbon layer 600 forming epitaxial buffer layer 710. In the example embodiment, epitaxial buffer layer 710 is an epitaxial layer of silicon carbide. This method of ELO or MELO over the regions of carbon layer 600 enables the formation of epitaxial buffer layer 710 with low defect density over portions of carbon layer 600.

Substrate 100 with regions of carbon layer 600 below epitaxial buffer layer 710 forms a plane where epitaxial buffer layer 710 can be exfoliated from substrate 100 in subsequent process steps. This plane of separation comprises regions of carbon 600 and portions of substrate 100 and epitaxial buffer layer 710. In one embodiment, epitaxial buffer layer 710 is grown in an epitaxial reactor using CVD (Chemical Vapor Deposition) epitaxial growth processes or by modified bulk crystal growth processes such as high Temperature CVD or by Physical Vapor Transport (PVT). In the example embodiment, epitaxial buffer layer 710 comprises of N+4H Silicon Carbide and can be of a thickness of about 5-20 micrometers. In another embodiment, P+ silicon carbide can be used for epitaxial buffer layer 710. The doping of epitaxial buffer layer 710 is high enough to provide an ohmic contact for the silicon carbide device formed on epitaxial buffer layer 710 during subsequent processing steps.

Figure 8:
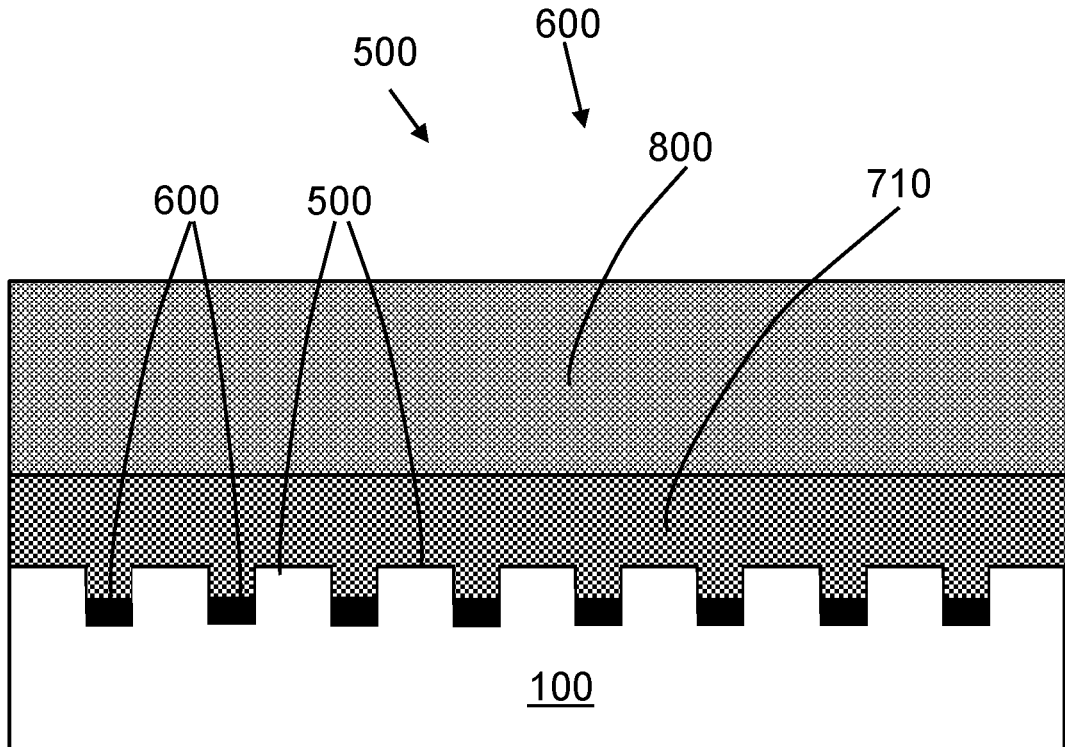
FIG. 8 is an illustration of an epitaxial device layer formed overlying the epitaxial buffer layer in accordance with an example embodiment.

FIG. 8 is an illustration of an epitaxial device layer 800 formed overlying epitaxial buffer layer 710 in accordance with an example embodiment. In one embodiment, a device is formed in epitaxial device layer 800 that is grown overlying epitaxial buffer layer 710 in an epitaxial reactor. In one embodiment, epitaxial device layer 800 and epitaxial buffer layer 710 comprises silicon carbide. In one embodiment, a device formed in epitaxial device layer 800 is a MOSFET (Metal Oxide Semiconductor Field effect Transistor).

In one embodiment, prior to the epitaxial growth of epitaxial device layer 800, a surface of epitaxial buffer layer 710 may be lightly polished using a polishing step called kiss polish to remove any surface defects on the surface of epitaxial buffer layer 710. In one embodiment, the doping and thickness of epitaxial device layer 800 is determined by the electrical requirements of devices that are formed in epitaxial device layer 800. In one embodiment, the thickness of epitaxial device layer 800 is determined by a breakdown voltage of the device formed in the epitaxial device layer 800 in subsequent processing steps and is typically between 10-30 micrometers. In an example embodiment, epitaxial device layer 800 is doped N- and has a thickness of about 10-12 micrometers for a device breakdown voltage of 1200 Volts. Epitaxial device layer 800 formed overlying epitaxial buffer layer 710 is used for formation of silicon carbide devices using processes well known to those skilled in the art. In the example embodiment, epitaxial device layer 800 is used for formation of a Trench MOSFET (Metal Oxide Semiconductor Field effect Transistor) or trench FET (Field Effect Transistor) in accordance with an example embodiment.

In one embodiment, epitaxial device layer 800 overlying epitaxial buffer layer 710 enables the formation of silicon carbide devices that can subsequently be separated from substrate 100 by method of exfoliation that may be thermal, mechanical, and other techniques. A combination of techniques may also be used for used for the exfoliation of epitaxial device layer 800 and epitaxial buffer layer 710 on which semiconductor devices can be fabricated. It should be also noted that the exfoliation process disclosed herein supports reuse of substrate 100 as epitaxial device layer 800 and epitaxial buffer layer 710 comprises only a portion of substrate 100. In one embodiment, a substrate 100 can be prepared to be reused multiple times to form more devices.

Figure 9:
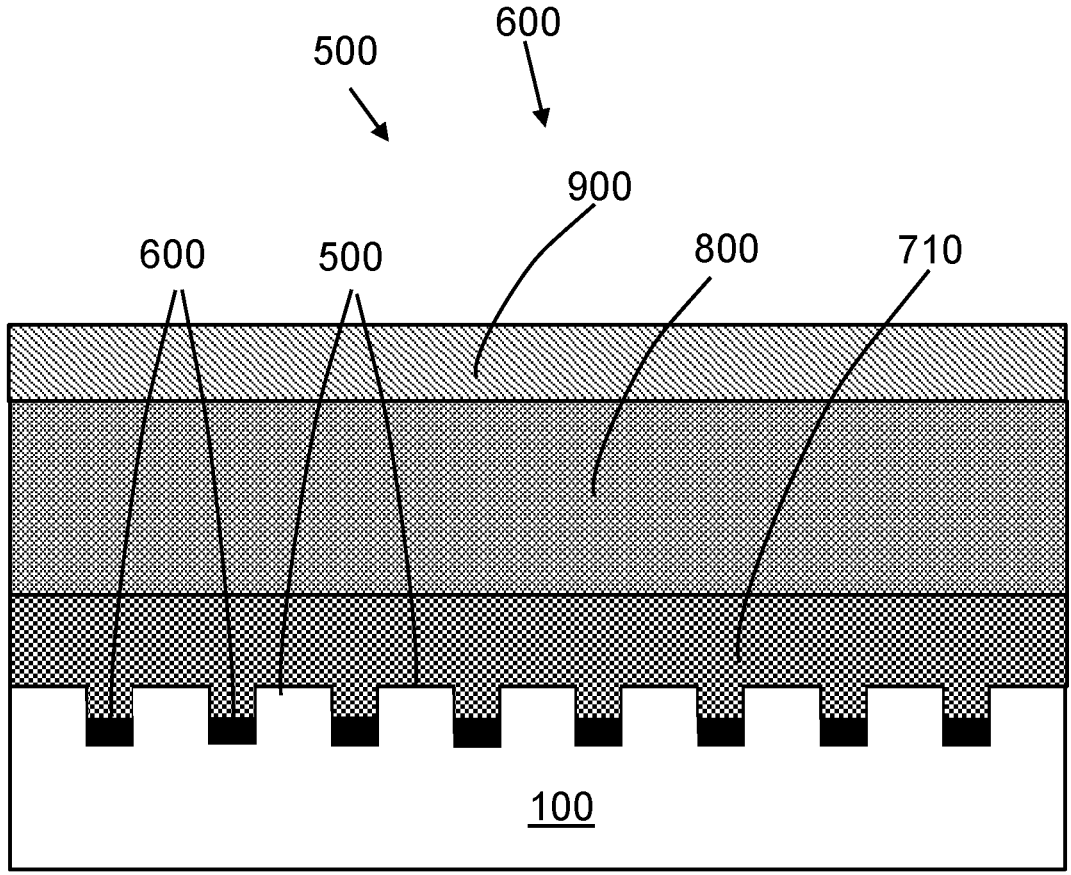
FIG. 9 is an illustration of a device body layer formed overlying an epitaxial device layer in accordance with an example embodiment.

FIG. 9 is an illustration of a device body layer 900 of a trench field effect transistor (FET) formed overlying epitaxial device layer 800 in accordance with an example embodiment. Device body layer 900 is used for forming the channel region of the transistor. In one embodiment, device body layer 900 may be grown in an epitaxial reactor and doped with P+ type dopant. In another embodiment, device body layer 900 may be formed by implantation of dopant species into epitaxial device layer 800 and annealing at high temperatures to form device body layer 900. In one embodiment, device body layer 900 may be implanted using an implant mask to selectively implant dopant species and subsequent annealing to form device body layer 900 in specific regions of epitaxial device layer 800. The thickness of device body layer 900 may be in the range of 0.5-3 micrometers and may be adjusted based on the device performance.

Figure 10:
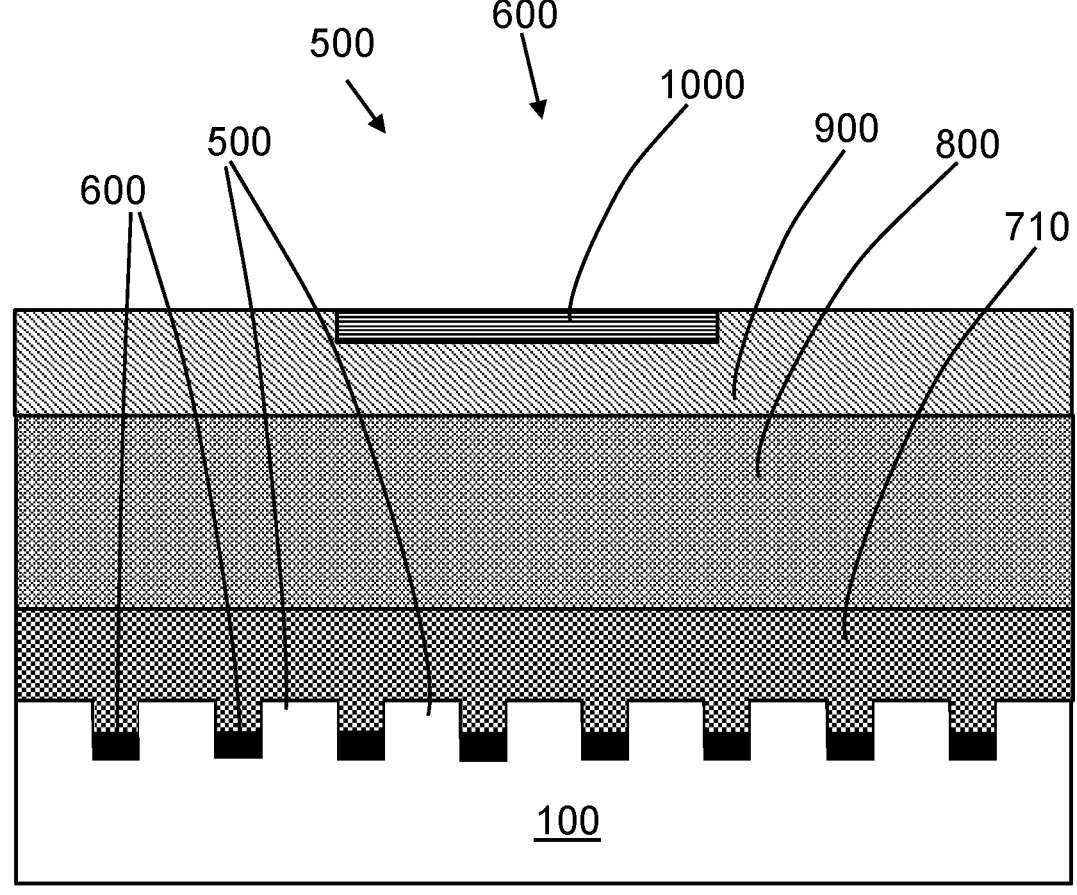
FIG. 10 is an illustration of a source region overlying device body layer of a trench field effect transistor (FET) in accordance with an example embodiment.

FIG. 10 is an illustration of a source region 1000 overlying device body layer 900 of a trench field effect transistor (FET) in accordance with an example embodiment. Source region 1000 overlying device body layer 900 trench FET is used for forming the source of the trench FET in an example embodiment. Source region 1000 is formed overlying device body layer 900 by using an implant mask and implanting dopants opposite in polarity to device body layer 900 and then subsequently annealing to form source region 1000 of the trench FET formed as disclosed in subsequent process steps. In one embodiment, source region 1000 is formed by implanting nitrogen into device body layer 900 to form a N+ source region. The thickness of source region 1000 is in the range of 0.2-0.8 micrometers and the thickness of device body layer 900 determines the channel length of the trench FET in the example embodiment.

Figure 11:
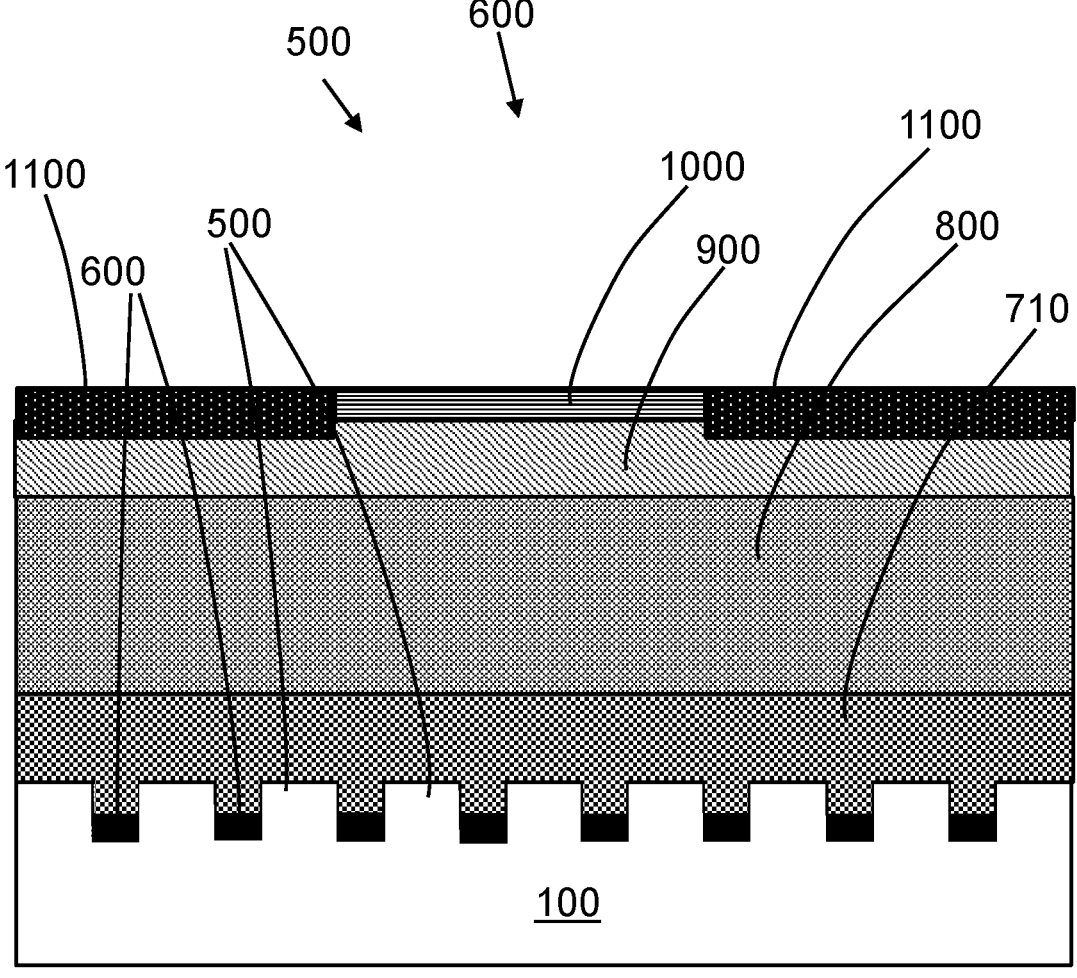
FIG. 11 is an illustration of termination regions of the trench FET formed overlying the epitaxial device layer in accordance with an example embodiment.

FIG. 11 is an illustration of termination regions 1100 of the trench FET formed overlying device body layer 900 in accordance with an example embodiment. Termination regions 1100 are used to provide termination of the electric field lines of the trench FET during device operation. In one embodiment, termination regions 1100 are formed by floating field rings of doped regions in device body layer 900 overlying epitaxial device layer 800. The number and size of the floating field rings is determined by the device designer and the electrical performance of the trench FET. In one embodiment, floating field rings of termination regions 1100 may be formed by selective implantation of dopants. In one embodiment, floating field rings of termination regions may be formed by selective masked implantation of P+ dopants into underlying device body layer 900. In another embodiment, termination regions 1100 may be implemented using trench isolation to provide termination to device electrical fields. Termination regions 1100 formed by using trench isolation comprises etching trenches into device body layer 900 overlying epitaxial device layer 800 and refilling with dielectric layers to provide electrical isolation. A dielectric layer using to refill trench terminations may comprise silicon dioxide, silicon nitride among others or may comprise of multiple layers of dielectric isolation layers. The number, width, depth of the trench isolation structures and thickness of dielectric layers used in the trench isolation structures are determined by the device designer and the electrical performance of the trench FET.

Figure 12:
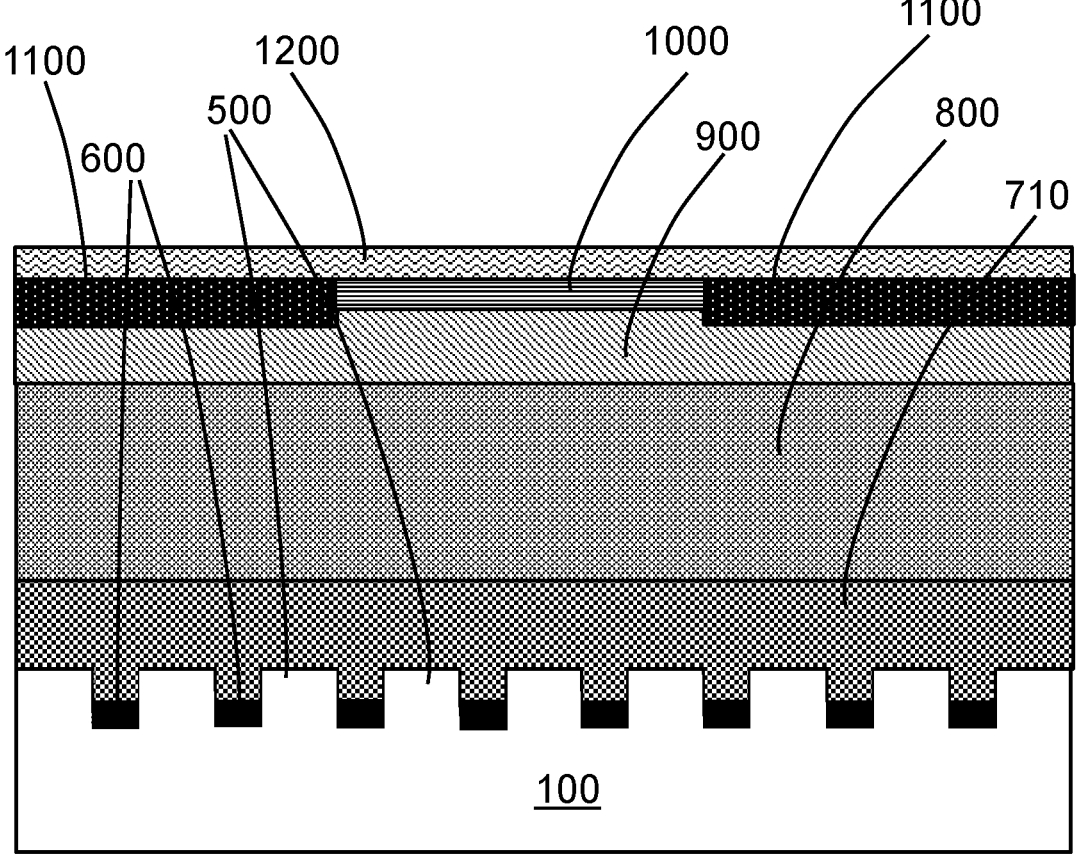
FIG. 12 is an illustration of a second hard mask layer deposited overlying the termination regions and the source region of the trench FET in accordance with an example embodiment.

FIG. 12 is an illustration of a second hard mask layer 1200 overlying termination regions 1100 and source region 1000 of the trench FET in an example embodiment. Second hard mask layer 1200 is used in the formation of the trench region of the trench FET in the example embodiment. Second hard mask layer 1200 is used for subsequent patterning of the trench FET and may be composed of one or more layers. In one embodiment, second hard mask layer 1200 comprises a layer of LPCVD Silicon Nitride. In another embodiment, second hard mask layer 1200 comprises a layer of PECVD Oxide overlying a layer of LPCVD Nitride. In another embodiment, second hard mask layer 1200 comprises a deposited layer of metal overlying a layer of LPCVD Silicon Nitride. The thickness of second hard mask layer 1200 may be 0.5-5 micrometers in thickness and may comprise one or more layers and materials. A metal layer used as second hard mask layer 1200 may comprise nickel, which may be sputtered, evaporated, electroplated or a combination of different deposition methods.

Figure 13:
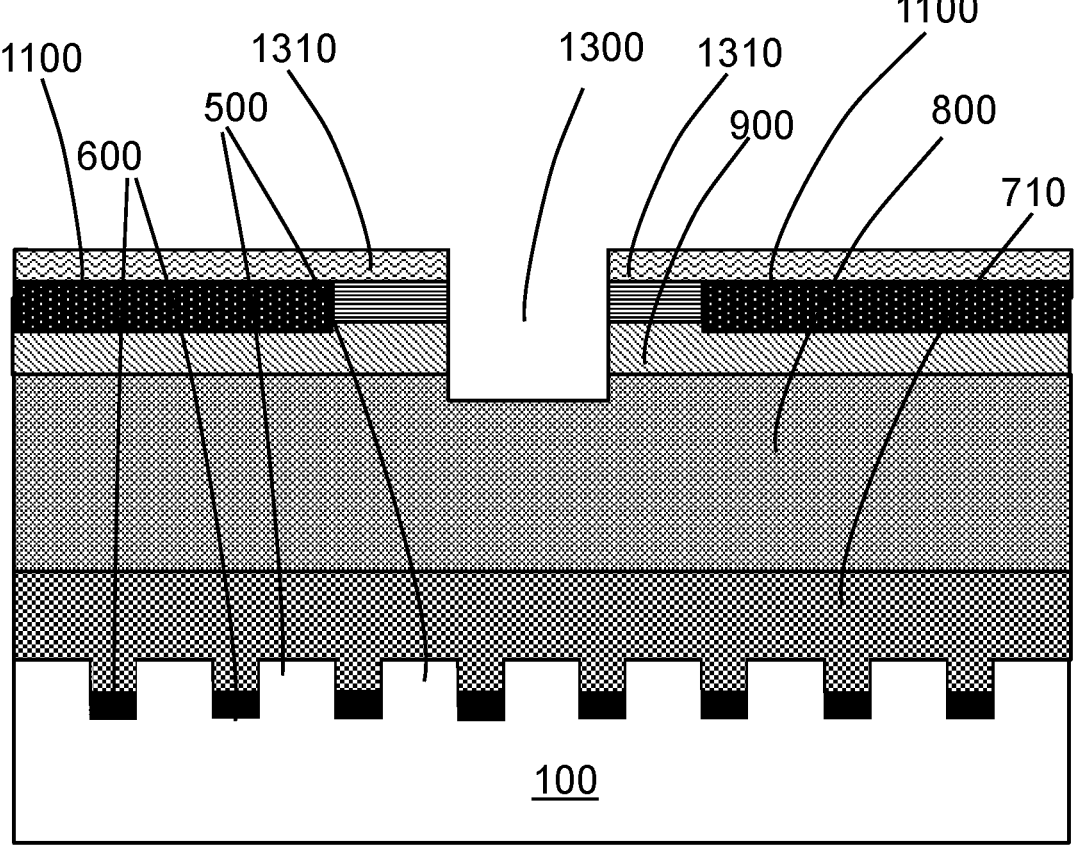
FIG. 13 is an illustration of a trench formed through the source region of the trench FET in accordance with an example embodiment.

FIG. 13 is an illustration of patterned hard mask regions 1310 with a trench 1300 formed through source region 1000 of the trench FET in accordance with an example embodiment. In one embodiment, second hard mask layer 1200 from FIG. 12 is patterned using photoresist and optical lithography and etched using reactive ion etching (RIE).

In one embodiment, second hard mask layer 1200 of FIG. 12 comprises silicon nitride and is patterned to form patterned hard mask regions 1310 using RIE using fluorine chemistry. After the patterning and etching of second hard mask layer 1200, exposed silicon carbide is etched through device body layer 900 and partially into epitaxial device layer 800 using Reactive Ion Etching using fluorine chemistry to form trench 1300 of the trench FET. In one embodiment, Inductively Coupled Plasma (ICP) may be used to etch trench 1300. The width of trench 1300 may be 0.3-2 micrometers and the depth of trench 1300 may be 0.7-2 micrometers and corresponds to the device channel length. In one embodiment, the profile of the sidewalls of trench 1300 may be vertical and is formed by adjusting the etch chemistry, gas flows, pressure and plasma power used for the Reactive Ion Etching that forms trench 1300.

Figure 14:
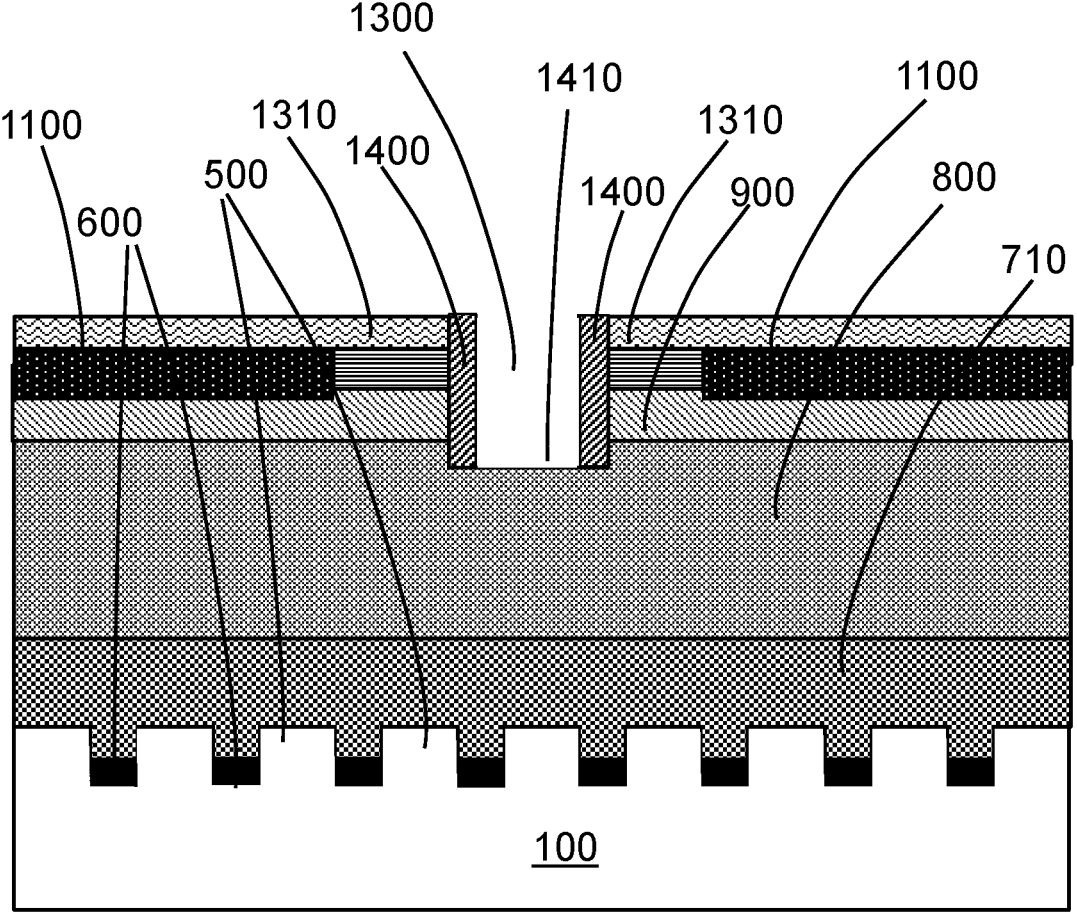
FIG. 14 is an illustration of an insulating layer formed on walls of the trench formed through the source of the trench FET in accordance with an example embodiment.

FIG. 14 is an illustration of an insulating layer 1400 formed on walls of trench 1300 formed through source region 1000 in accordance with an example embodiment. Insulating layer 1400 formed on walls of trench 1300 acts as spacers to enable selective oxidation of trench bottom 1410 in subsequent processing steps. In one embodiment, insulating layer 1400 forming spacers in the sidewalls of trench 1300 comprises LPCVD Silicon nitride. In one embodiment, a layer of LPCVD silicon nitride is deposited to conformally coat the surface of trench 1300 and portions of patterned hard mask regions 1310. A blanket etch using RIE (Reactive Ion Etching) is used to remove LPCVD silicon nitride from surface of patterned hard mask regions 1310 and bottom of trench 1300 leaving spacers of insulating layer 1400 on the sidewalls of trench 1300 and exposing silicon carbide of underlying epitaxial device layer 800 in trench bottom 1410. The thickness of insulating layer 1400 and second hard mask layer 1200 from FIG. 12 are chosen to ensure that remaining thickness of patterned hard mask regions 1310 of hard mask layer 1200 from FIG. 12 are sufficient to withstand the blanket RIE etch used for the spacer formation and also sufficient for subsequent processing steps in the fabrication of the trench FET in the example embodiment.

Figure 15:
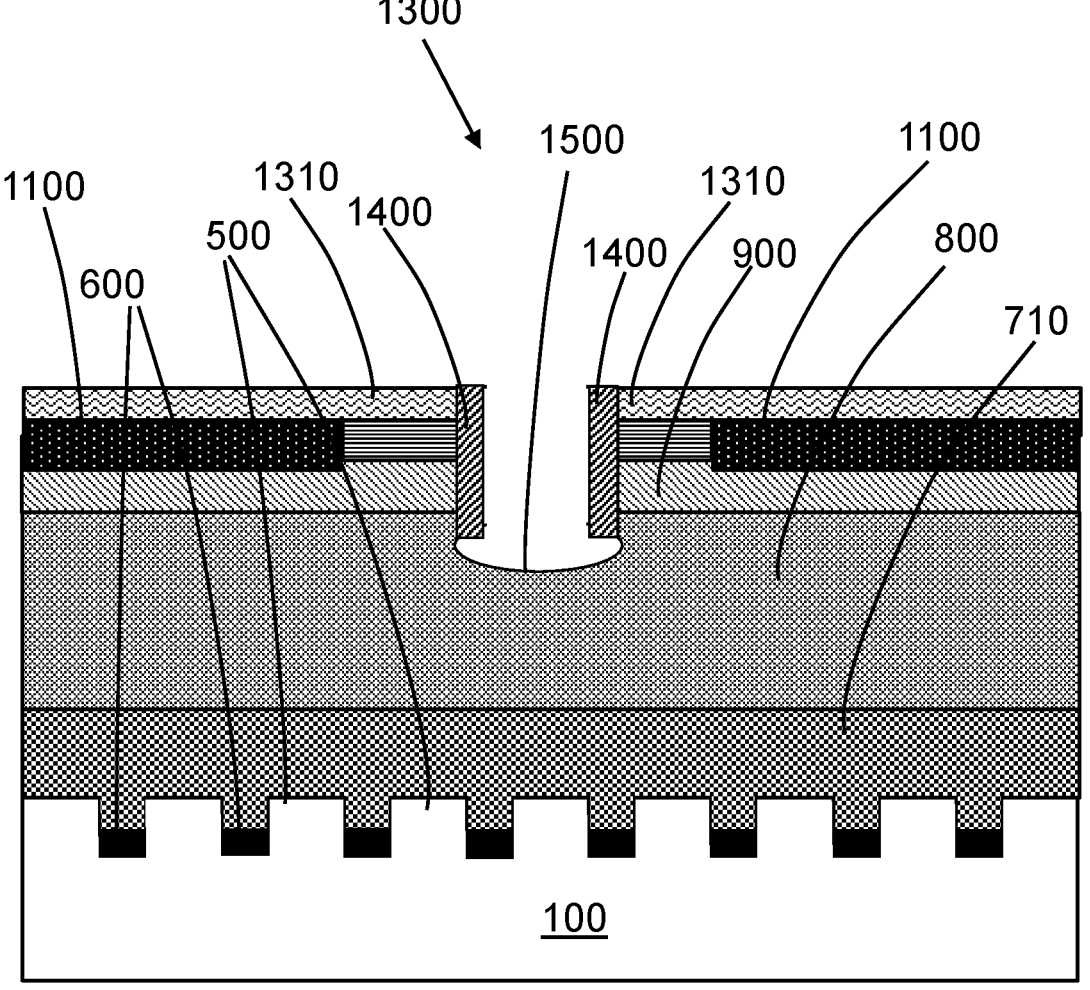
FIG. 15 is an illustration of an isotropically etched trench bottom etched below the insulating layer formed on the walls of the trench in accordance with an example embodiment.

FIG. 15 is an illustration of an isotropically etched trench bottom 1500 etched below insulating layer 1400 formed on the walls of trench 1300 in accordance with an example embodiment. In an example embodiment, trench bottom 1410 of FIG. 14 is etched substantially isotropically to form a curved surface below insulating layer 1400 formed in the sidewalls of trench 1300 such that isotropically etched trench bottom 1500 is formed. In the example embodiment, trench bottom 1410 of FIG. 14 exposes silicon carbide of device body layer 900. In the example embodiment, insulating layer 1400 comprises silicon nitride. An edge of isotropically etched trench bottom 1500 is rounded to improve electrical device reliability of trench FET as disclosed herein below. The profile of isotropically etched trench 1500 can be achieved by etching trench bottom 1410 using dry etching (Reactive Ion Etching) or wet etching (wet electrochemical or anodic etching. In one embodiment, RIE chemistries using SF6, CHF3, CF4 and similar gases may be used to etch trench bottom 1410 to form isotropically etched trench bottom 1500 by using suitable gas flows, chemistries, power and temperature. In another embodiment, the method of electrochemical etching can be used to form the curved profile of isotropically etched trench bottom 1500 by varying the current density, bias voltage, power, or chemical concentrations. It is also possible to use a RIE step combined with wet chemical etching to achieve the curved profile of isotropically etched trench bottom 1500. In one embodiment, RIE with elevated temperature of the platen used as an electrode for the plasma etching can be used to increase the isotropic etch profile.

Figure 16:
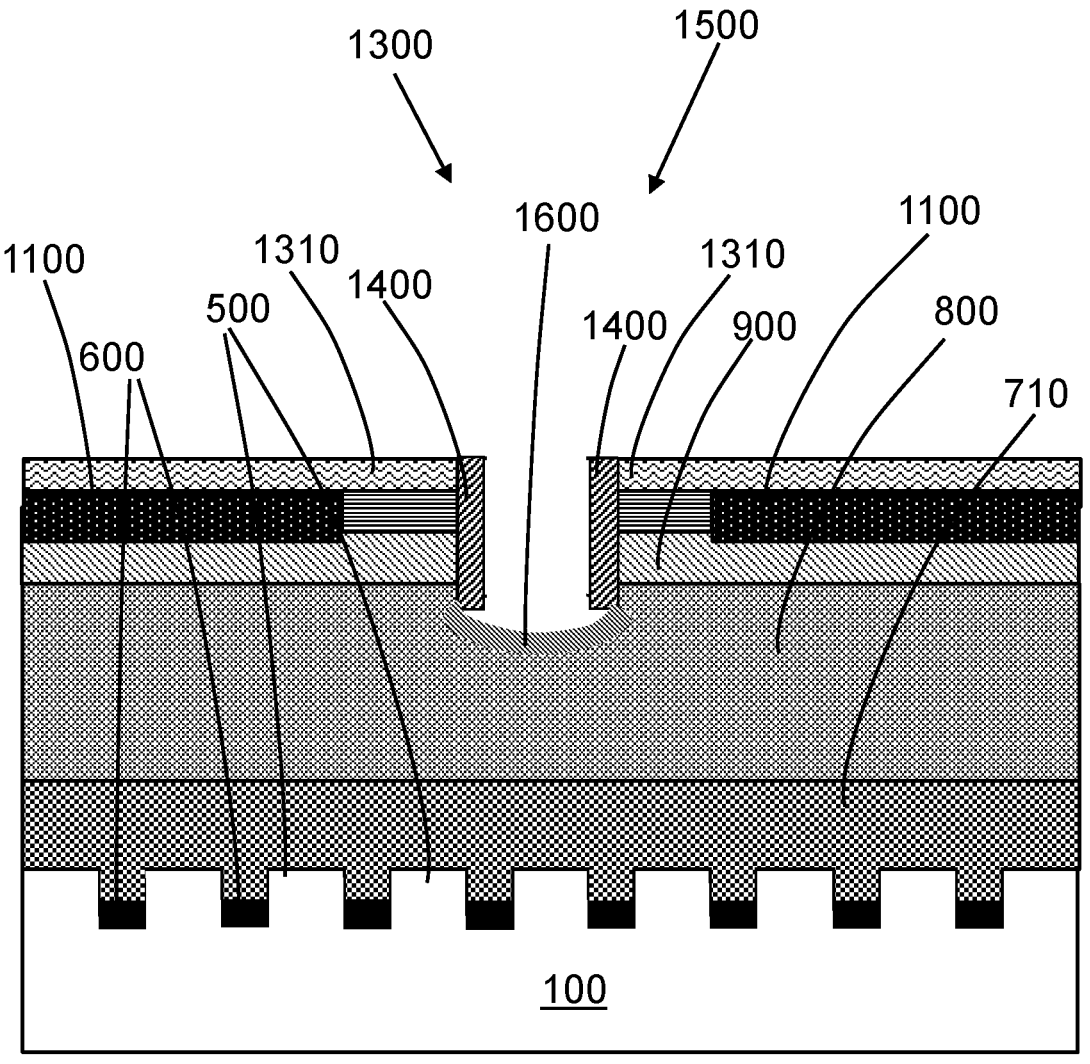
FIG. 16 is an illustration of an oxide layer formed overlying the isotropically etched trench bottom in fabrication of the trench FET in accordance with an example embodiment.

FIG. 16 is an illustration of an oxide layer 1600 formed in isotropically etched trench bottom 1500 in accordance with an example embodiment. In an example embodiment, isotropically etched trench bottom 1500 from FIG. 15 is selectively oxidized below insulating layer 1400 formed overlying walls of trench 1300. In the example embodiment, oxide layer 1600 overlying isotropically etched trench bottom 1500 is formed by placing the substrate 100 in a thermal oxidation furnace and treating it with wet oxidation or dry oxidation processes. In the example embodiment, substrate 100 comprises silicon carbide. In one embodiment, wet oxidation comprises a mixture of saturated water vapor and oxygen in a high temperature furnace to form oxide layer 1600. In one embodiment, dry oxidation comprises supplying oxygen gas at high temperatures to form oxide layer 1600. While wet oxidation has higher growth rates, the quality of the oxide is not very good due to higher density of interface states leading to reduced dielectric breakdown strength. Dry oxidation has lower density of interface states while having a lower rate of oxide growth. In one embodiment, a combination of dry oxidation and wet oxidation is used to form oxide layer 1600. In an example embodiment, an initial oxidation layer is formed by using dry oxidation to ensure a good interface state. Wet oxidation is then used to growth the major portion of thickness of oxide layer 1600 to take advantage of the higher growth rate of wet oxidation. The oxidation is completed with a dry oxidation process followed by annealing in argon to reduce the number of interface defect states. In one embodiment, a combination of dry/wet/dry oxidation is used to form oxide layer 1600 in isotropically etched trench bottom 1500 selectively. Since the sidewalls of trench 1300 is protected by insulating layer 1400, there is no oxide growth on the sidewalls of trench 1300. The thickness of oxide layer 1600 formed selectively in isotropically etched trench bottom 1500 is 0.2-1.0 micrometers thick and is used to improve the trench FET electrical performance by reducing drain to gate capacitance (Cgd) of the trench FET as will be explained in greater detail herein below. Since patterned hard mask regions 1310 protects the surface of the device body layer 900 and epitaxial device layer 800, there is no oxide growth in these regions.

Figure 17:
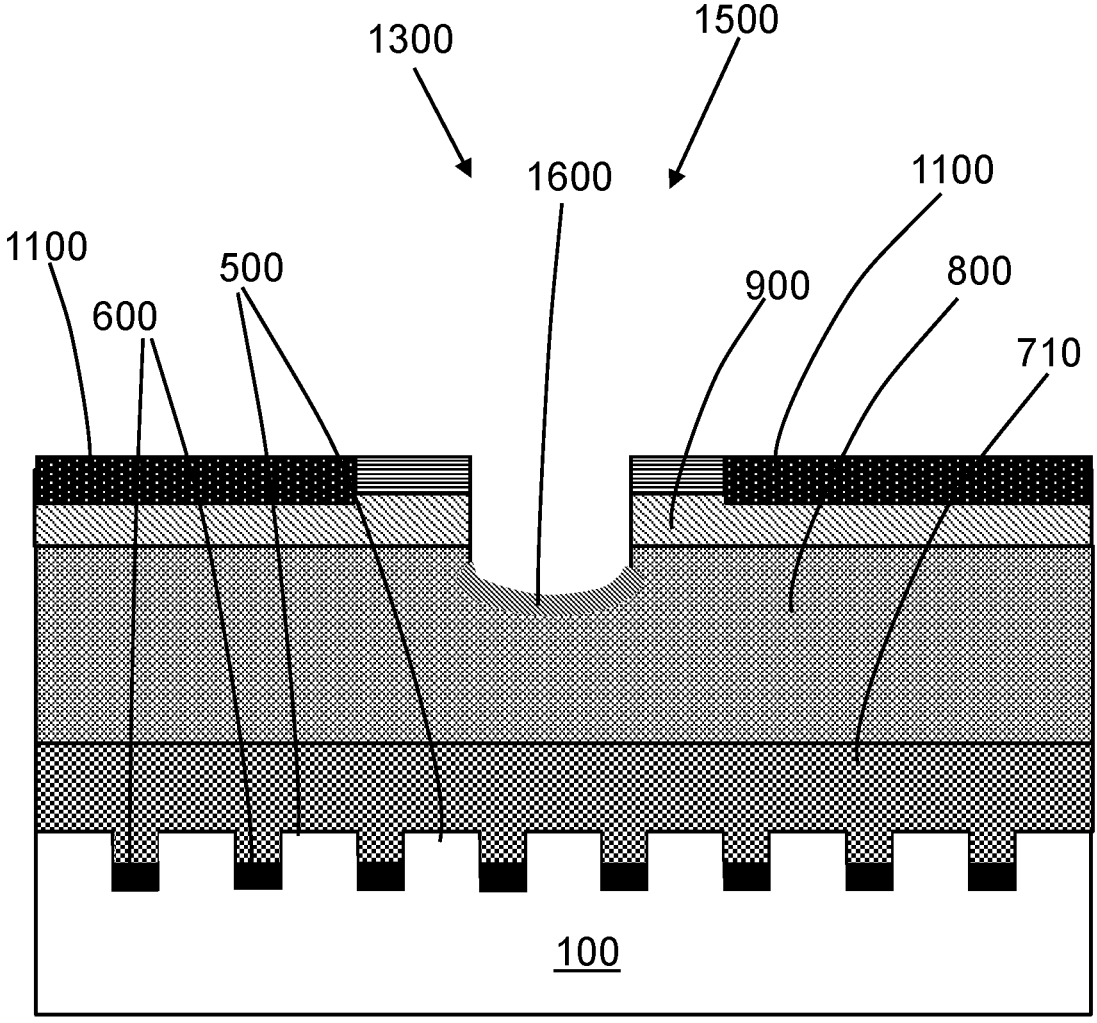
FIG. 17 is an illustration of the oxide layer formed in the isotropically etched trench bottom in accordance with an example embodiment.

FIG. 17 is an illustration of the trench FET with oxide layer 1600 formed in isotropically etched trench bottom 1500 in accordance with an example embodiment. Insulating layer 1400 of FIG. 16 is removed from the walls of trench 1300. Patterned hard masked regions 1310 of FIG. 13 is removed overlying device body layer 900. In an example embodiment, insulating layer 1400 and patterned hard mask regions 1310 from FIG. 13 is comprised of silicon nitride and is removed using hot phosphoric acid which selectively removes insulating layer 1400 of FIG. 13 and patterned hard mask regions 1310 of FIG. 13 thereby leaving oxide layer 1600 in isotropically etched trench bottom 1500.

Figure 18:
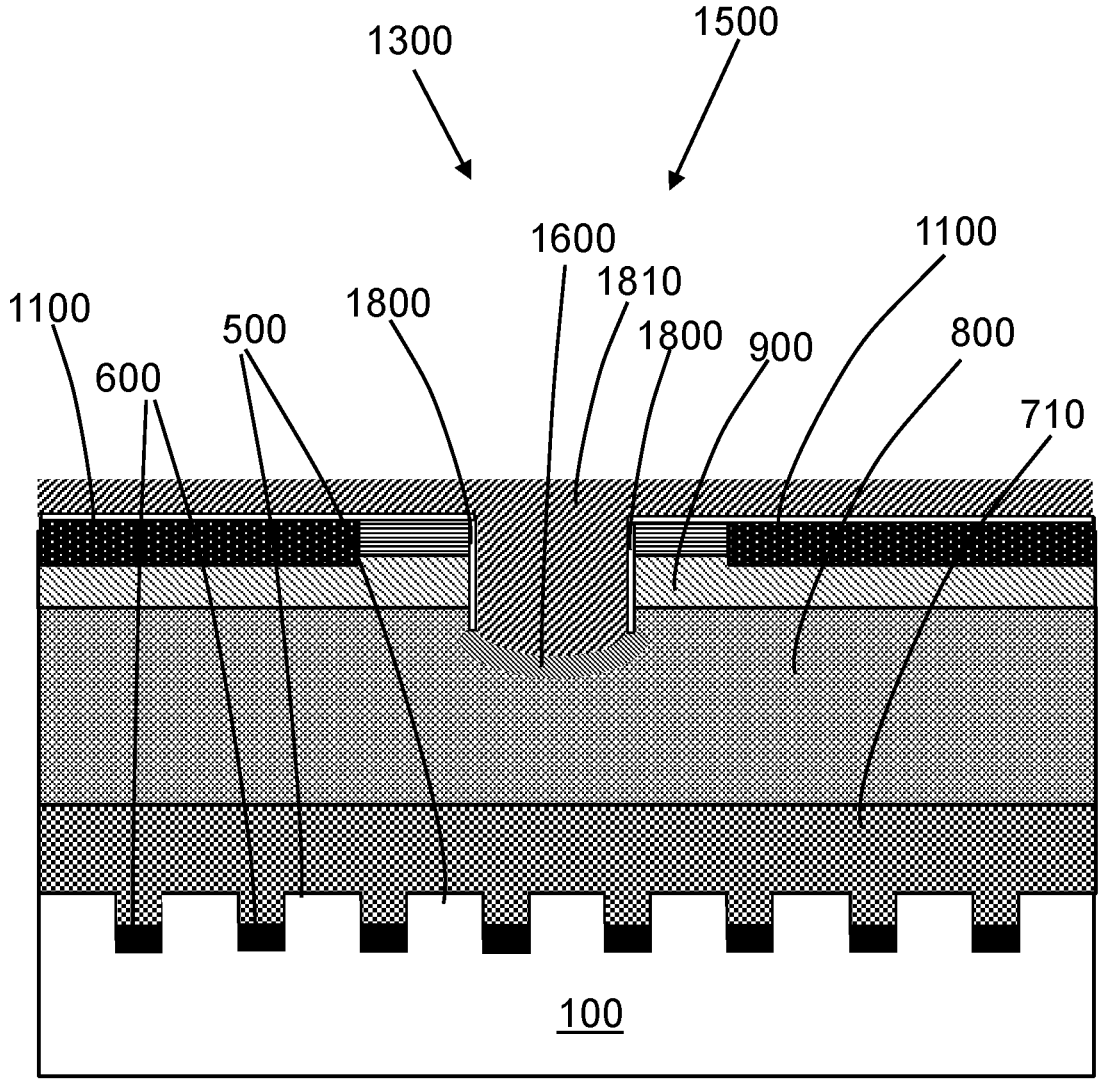
FIG. 18 is an illustration of a gate oxide and gate electrode layer formed in the trench FET in accordance with an example embodiment.

FIG. 18 is an illustration of an example embodiment of the trench FET with gate oxide 1800 and gate electrode layer 1810 formed in trench 1300 in accordance with an example embodiment. In an example embodiment, gate oxide 1800 is formed by deposition and overlies oxide layer 1600 in isotropically etched trench bottom 1500. The thickness of gate oxide 1800 is 200-5000 Angstroms is comprised of one or more layers of gate dielectric materials. Gate electrode layer 1810 is formed by depositing LPCVD Polysilicon overlying gate oxide 1800 and in an example embodiment comprises in-situ doped polycrystalline silicon deposited in a LPCVD furnace. The thickness of gate electrode layer 1810 is chosen to completely refill trench 1300. Note that gate oxide 1800 overlies the sidewalls of trench 1300 and may be in the range of 0.3-2 micrometers in thickness. Gate electrode layer 1810 may be doped by n-type or p-type dopants. In an example embodiment, gate electrode layer 1810 is composed of n-type doped polysilicon. Gate electrode layer 1810 is separated from a portion of epitaxial device layer 800 since isotropically etched trench bottom 1500 is covered with oxide layer 1600. This greatly reduces the gate to drain capacitance (Cgd) of the trench FET thereby improving electrical performance of the device. Since the gate to drain capacitance, also known as the Miller capacitance, is reduced by the thickness of oxide layer 1600, the device performance is improved in terms of operating frequency. As an example, if the thickness of oxide layer 1600 is at least five times than the thickness of gate oxide 1800 overlying oxide layer 1600, the Miller capacitance may be reduced by a factor of five, thus increasing the device operating frequency.

The isotropically etched trench bottom 1500 also improves electrical reliability of the trench FET by reducing the peak electric field seen by gate oxide 1800 especially during the blocking state of operation of the field effect transistor. By reducing the radius of curvature in the corner of isotropically etched trench bottom 1500 and forming oxide layer 1600 thereon, the peak electric field of gate oxide 1800 is kept below the breakdown voltage of the chosen thickness of gate oxide 1800 leading to more reliable operation of the trench FET. The reduced curvature of the corner of the trench with isotropically etched trench bottom 1500 and covered by oxide layer 1600 improves the device operation by keeping the peak electric field in the blocking state below the critical electric field for the particular chosen thickness of gate oxide 1800. In addition, the device operation is improved with higher operating frequency of the trench FET by reducing the device gate to drain capacitance (Cgd) from gate electrode layer 1810 to the transistor drain region by the implementation of a thick oxide layer 1600 in isotropically etched trench bottom 1500 below gate oxide 1800 and gate electrode layer 1810. The rounded corners of the bottom of the trench FET implemented by isotropically etched trench bottom 1500 and covered by oxide layer 1600 improves the device reliability by reducing the peak electric field below the critical field while also improving the device performance by reducing the Cgd coupled between the gate and drain of the trench FET.

Figure 19:
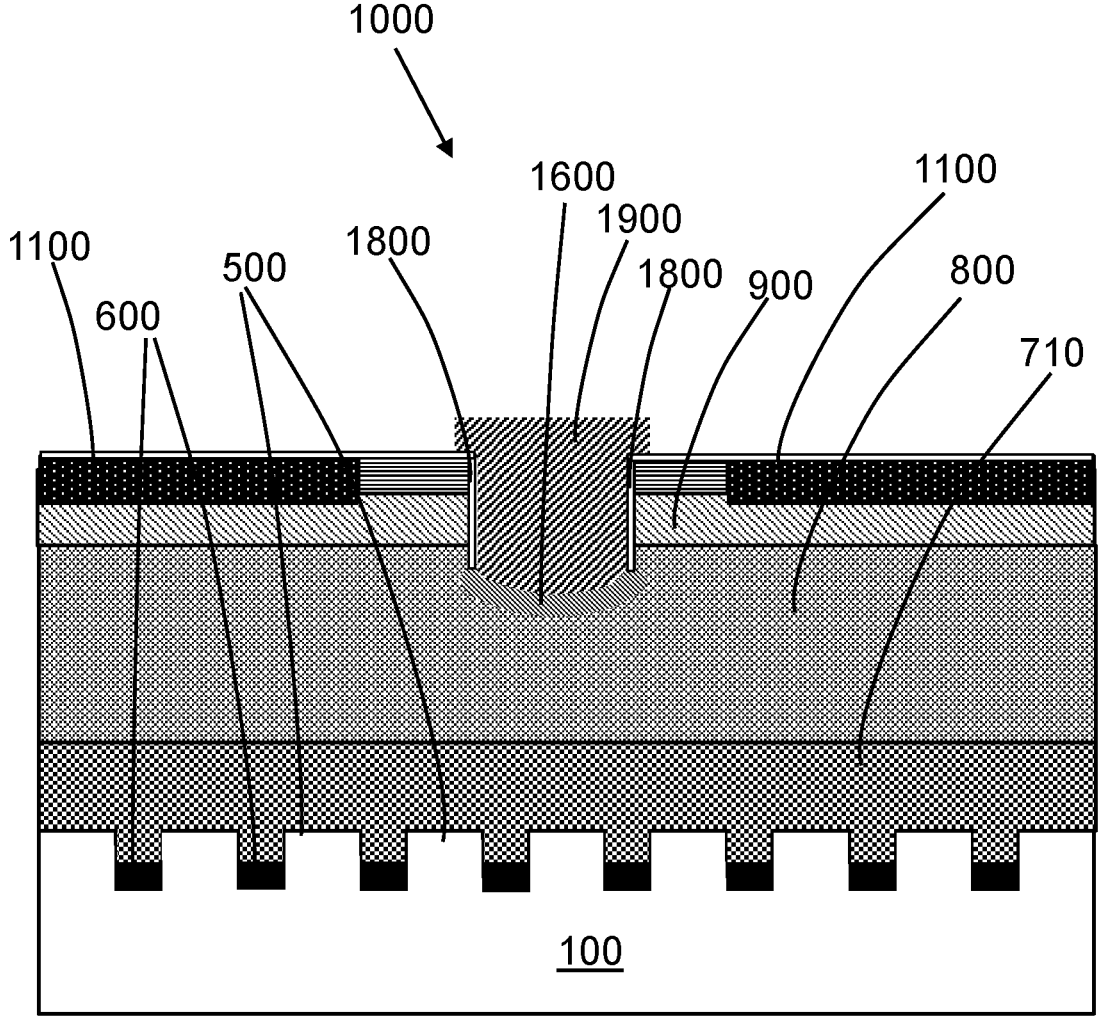
FIG. 19 is an illustration of the trench FET having a gate electrode overlying a gate oxide in accordance with an example embodiment.

FIG. 19 is an illustration of the trench FET with gate electrode 1900 formed from gate electrode layer 1810 overlying gate oxide 1800 in accordance with an example embodiment. Gate electrode layer 1810 of FIG. 18 is patterned and etched to form gate electrode 1900 of the example trench FET. In the example embodiment, gate electrode layer 1810 of FIG. 18 comprises doped polycrystalline silicon and is patterned and etched by using optical lithography and Reactive Ion Etching (RIE). In one embodiment, the optical lithography tool uses a mask with a stepper and etched using RIE using Fluorine based chemistry such as SF6 to etch gate electrode layer 1810 to form gate electrode 1900.

In another embodiment, gate electrode layer 1810 from FIG. 18 is etched with a blanket etch using RIE to make it substantially planar and exposing underlying oxide from gate oxide 1800 over source region 1000. In another embodiment, gate electrode layer 1810 is converted into oxide by oxidation in a furnace to be substantially planar with surface of layer of gate oxide over source region 1000.

Figure 20:
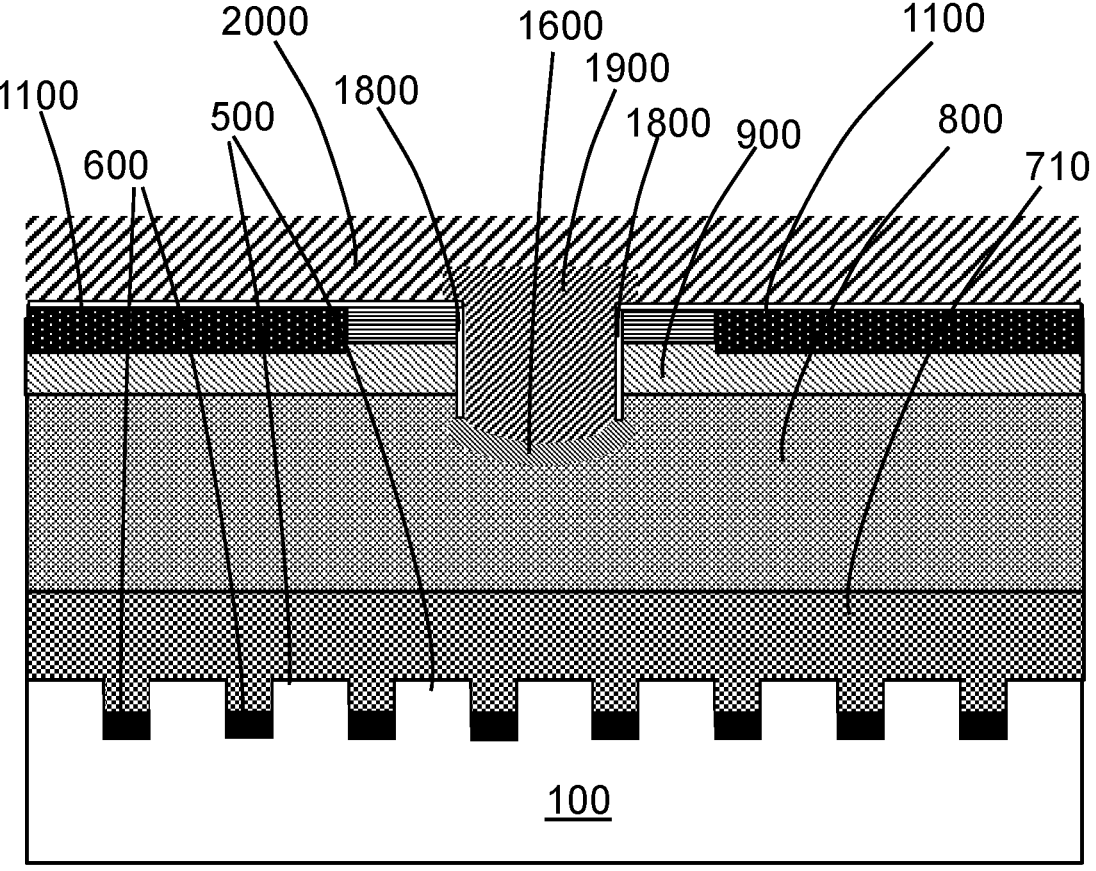
FIG. 20 is an illustration of a dielectric isolation layer deposited over gate electrode of the trench FET in accordance with an example embodiment.

FIG. 20 is an illustration of a dielectric isolation layer 2000 deposited over gate electrode 1900 of the trench FET in accordance with an example embodiment. Dielectric isolation layer 2000 is deposited by using PECVD Silicon Dioxide, PECVD Silicon Nitride, PECVD, or Silicon Oxynitride among other films. In one embodiment, the thickness of dielectric isolation layer 2000 is in a range of 1.0-4.0 micrometers. In the example embodiment, dielectric isolation layer 2000 is PECVD Silicon Oxide and is approximately one micrometer thick. In one embodiment, dielectric isolation layer 2000 is formed by oxidation of gate electrode layer 1810 formed by deposition of doped LPCVD polysilicon. In another embodiment, dielectric isolation layer 2000 may be formed by deposition of multiple layers of dielectric isolation layers.

Figure 21:
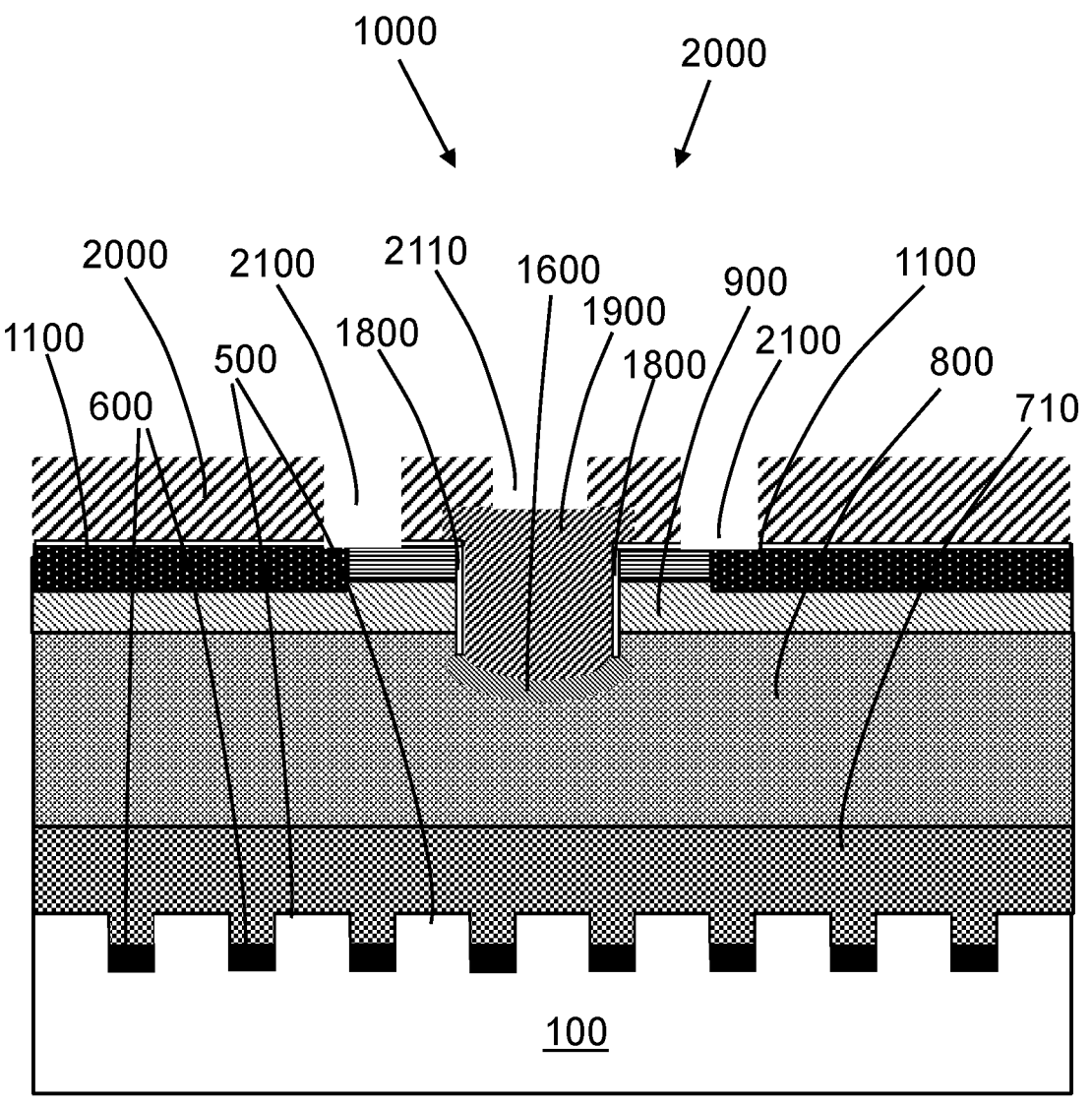
FIG. 21 is an illustration of a plurality of contact openings etched in the dielectric isolation layer of the trench FET in accordance with an example embodiment.

FIG. 21 is an illustration of a plurality of contact openings etched in dielectric isolation layer 2000 of the trench FET in accordance with an example embodiment. Source contact openings 2100 are formed to make contact with source region 1000 and gate contact opening 2110 is formed to make contact with gate electrode 1900.

Dielectric isolation layer 2000 is patterned and etched using standard wafer processing steps to form contact openings exposing a portion of ohmic source region 1000 and gate electrode 1900. In one embodiment, photolithography techniques and etching of dielectric isolation layer 2000 to form source contact openings 2100 are done using RIE (Reactive Ion Etching), wet etching or a combination of etching steps. In the example embodiment, source contact openings 2100 are patterned using RIE. Also, gate contact opening 2110 to gate electrode 1900 is done using RIE (Reactive Ion Etching), wet etching or a combination of etching steps. In the example embodiment, gate contact opening 2110 is patterned using RIE.

Figure 22:
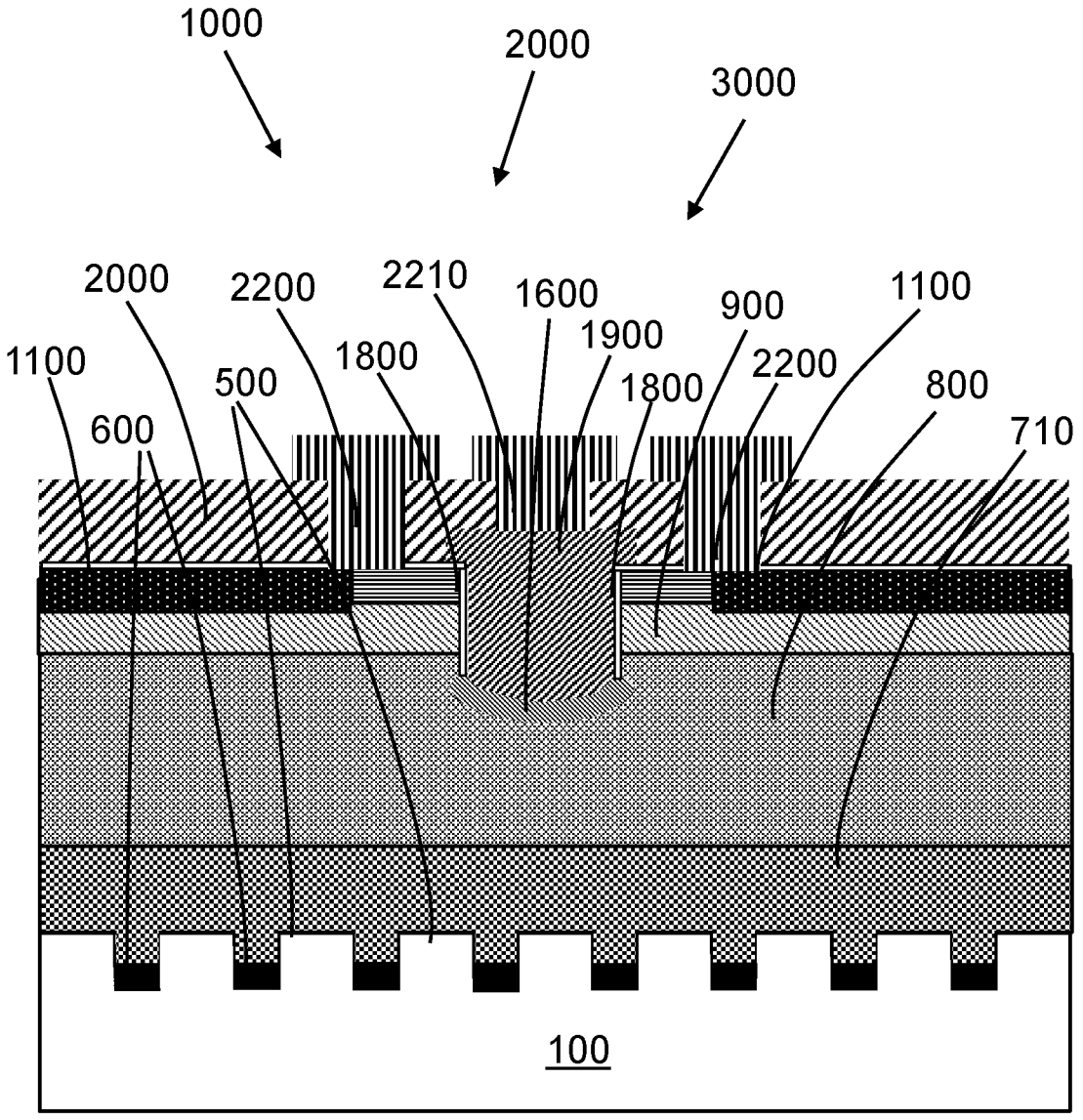
FIG. 22 is an illustration of a patterned metal contact layer configured to form electrical contacts of the electrodes of the trench FET in accordance with an example embodiment.

FIG. 22 is an illustration of a patterned metal contact layer configured to form electrical contacts of the electrodes of a trench FET in accordance with an example embodiment. Source metal contact layer 2200 makes contact with source region 1000 and gate metal contact layer 2210 makes contact with gate electrode 1900. Metal contact layer may be deposited using sputtering, e-beam evaporation, electrodeposition among other techniques and can also use a combination of metal deposition techniques. The metal layer may be patterned using lithography and etch to form source metal contact layer 2200 and gate metal contact layer 2210.

In addition, lift-off techniques may also be used for the deposition and patterning of a metal contact layer, as will be evident to those skilled in the art. The metal contact layer may be annealed or sintered to ensure good ohmic contact with source and gate regions of the trench FET. After formation of the metal contact layer, a passivation layer may be deposited and patterned to expose bond pads of gate and source electrodes on the trench FET in the example embodiment. At this stage, the fabrication of a trench FET 3000 is complete with improved electrical performance due to reduced gate to drain capacitance and improved electrical reliability due to reduced peak electrical field experienced by the trench FET in operation during the blocking state with isotropically etched trench bottom 1500 to reduce the radius of curvature and covering it with oxide layer 1600.

Figure 23:
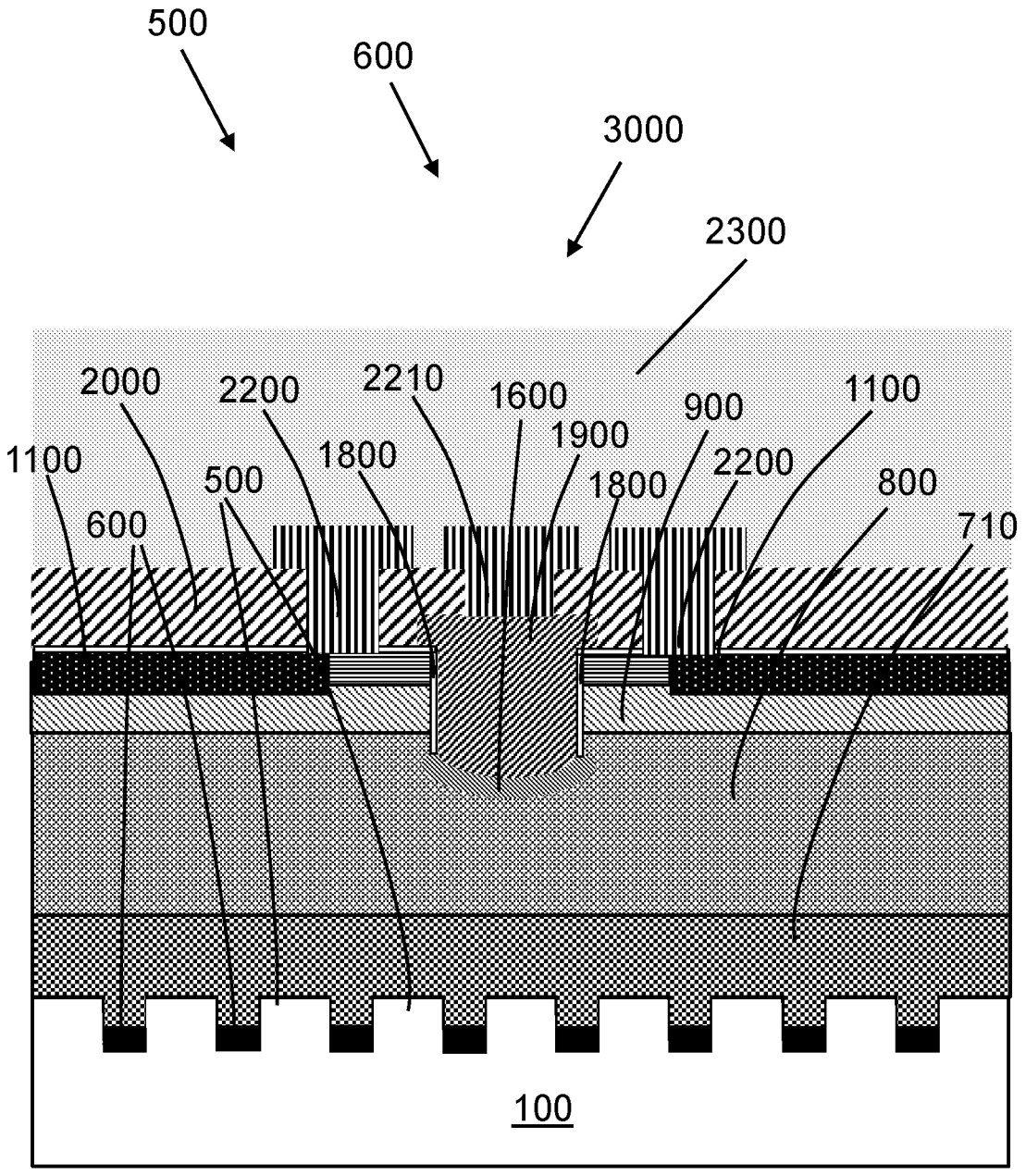
FIG. 23 is an illustration of a carrier wafer temporarily coupled to the trench FET in accordance with an example embodiment.

FIG. 23 is an illustration of a carrier wafer 2300 temporarily coupled to complete trench FET 3000 in accordance with an example embodiment. Substrate 100 with trench FET 3000 is temporarily coupled to carrier wafer 2300 to enable an exfoliation process. The exfoliation process occurs at an exfoliation layer comprising regions of carbon layer 600 from FIG. 5 adjacent to plurality of regions 500. In the example embodiment, plurality of regions 500 comprises silicon carbide. Thus, carbon layer 600 in proximity to plurality of regions 500 of silicon carbide is configured to form an exfoliating layer during the exfoliation process.

In one embodiment, carrier wafer 2300 is attached to trench FET 3000 by adhesives such as UV sensitive glue among others. Carrier wafer 2300 may be borosilicate glass which is UV transparent and may be used with a UVC curable adhesive for the bonding. Different methods of exfoliation may be used to separate a portion of substrate 100 with trench FET 3000 and reuse a remaining portion of substrate 100 comprising silicon carbide multiple times for fabrication of trench FET.

In an example embodiment, an exfoliation process using a laser is used. Carrier wafer 2300 coupled to trench FET 3000 is placed above a laser such that that the laser beam couples laser energy into the exfoliating layer comprising carbon layer 600 adjacent to plurality of regions 500 of substrate 100. In the example embodiment, substrate 100 is silicon carbide. The wavelength of the laser is chosen to be transparent to substrate 100 and couple only to regions of carbon layer 600.

The laser energy is selectively absorbed by carbon layer 600 and can reach several thousand degrees of temperature in Celsius. The laser may be used in continuous or pulsed mode. In one embodiment, the laser is used in pulsed mode so that the energy coupled causes a thermal shock in substrate 100 near carbon layer 600 that exfoliates a portion of substrate 100 along the exfoliating layer. In one embodiment, the exfoliation process is configured to separate substrate 100 from trench FET 3000 in a plane corresponding to carbon layer 600. One portion of the exfoliated layer comprises a portion of epitaxial buffer layer 710 with trench FET 3000 attached to carrier wafer 2300 and the other portion is the reminder of substrate 100 which is used multiple times for fabrication of trench FET devices. In general, there will be multiple trench FETs coupled to carrier wafer 2300 as the formation of trench FET 3000 is repeated across epitaxial buffer layer 710 as individual die that are subsequently separated from each other. The laser energy coupled to carbon layer 600 produces a thermal shock to cause the exfoliation along a plane of epitaxial buffer layer 710. The laser used for the exfoliation process may have a wavelength of 532 nanometers, 1064 nanometers, 623-700 nanometers or 632 nanometers for exfoliation of substrate 100.

Figure 24:
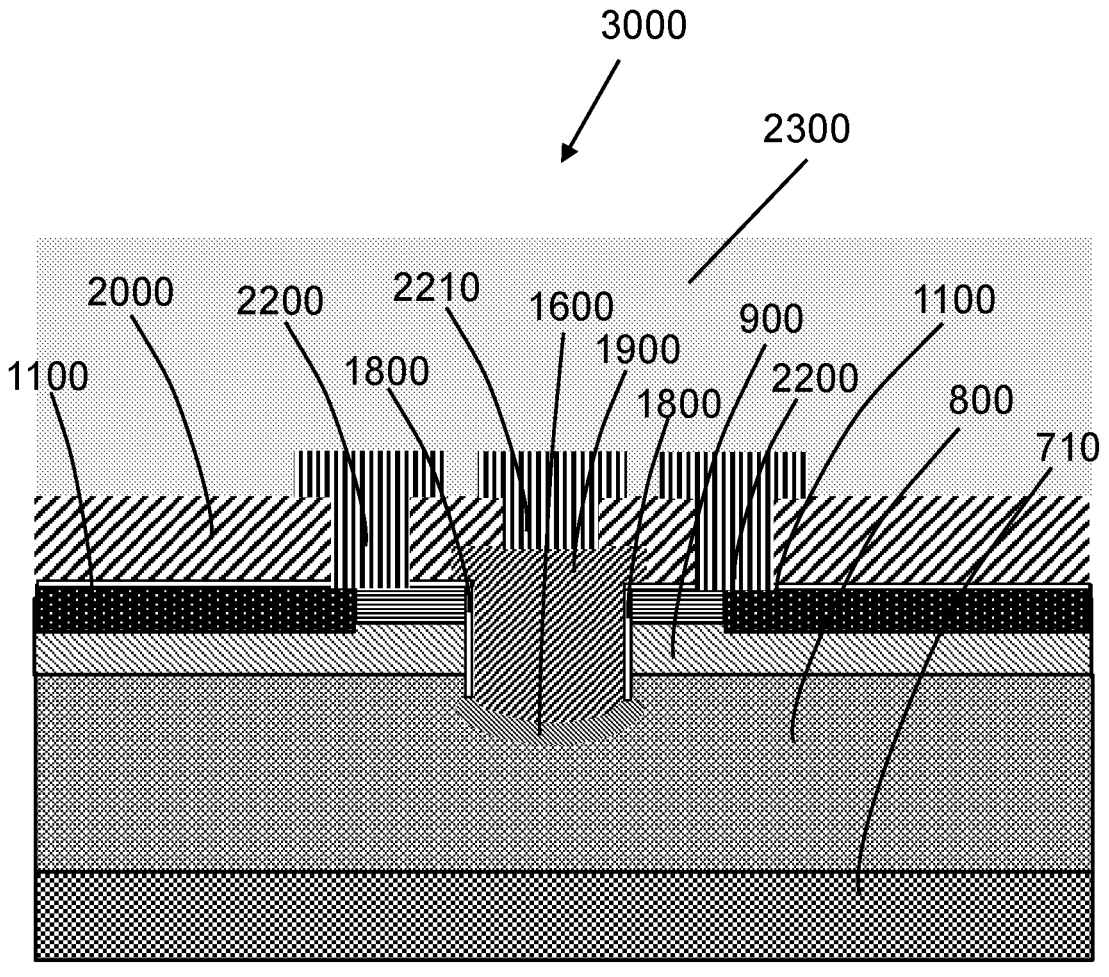
FIG. 24 is an illustration of the carrier wafer temporarily coupled to the trench FET after exfoliation in accordance with an example embodiment.

FIG. 24 is an illustration of carrier wafer 2300 temporarily coupled to trench FET 3000 after exfoliation in accordance with an example embodiment. As described above, thermal shock due to coupling of laser energy to carbon layer 600 of FIG. 23 in epitaxial buffer layer 710 is used to cause the exfoliation substrate 100 which is used multiple times to form trench FET devices. Since a portion of epitaxial buffer layer 710 used to support exfoliated trench FET 2400, The RDSon (drain to source resistance) is reduced, since a portion of epitaxial buffer layer 710 used to support exfoliated trench FET 3000 is removed by the exfoliation process.

Figure 25:
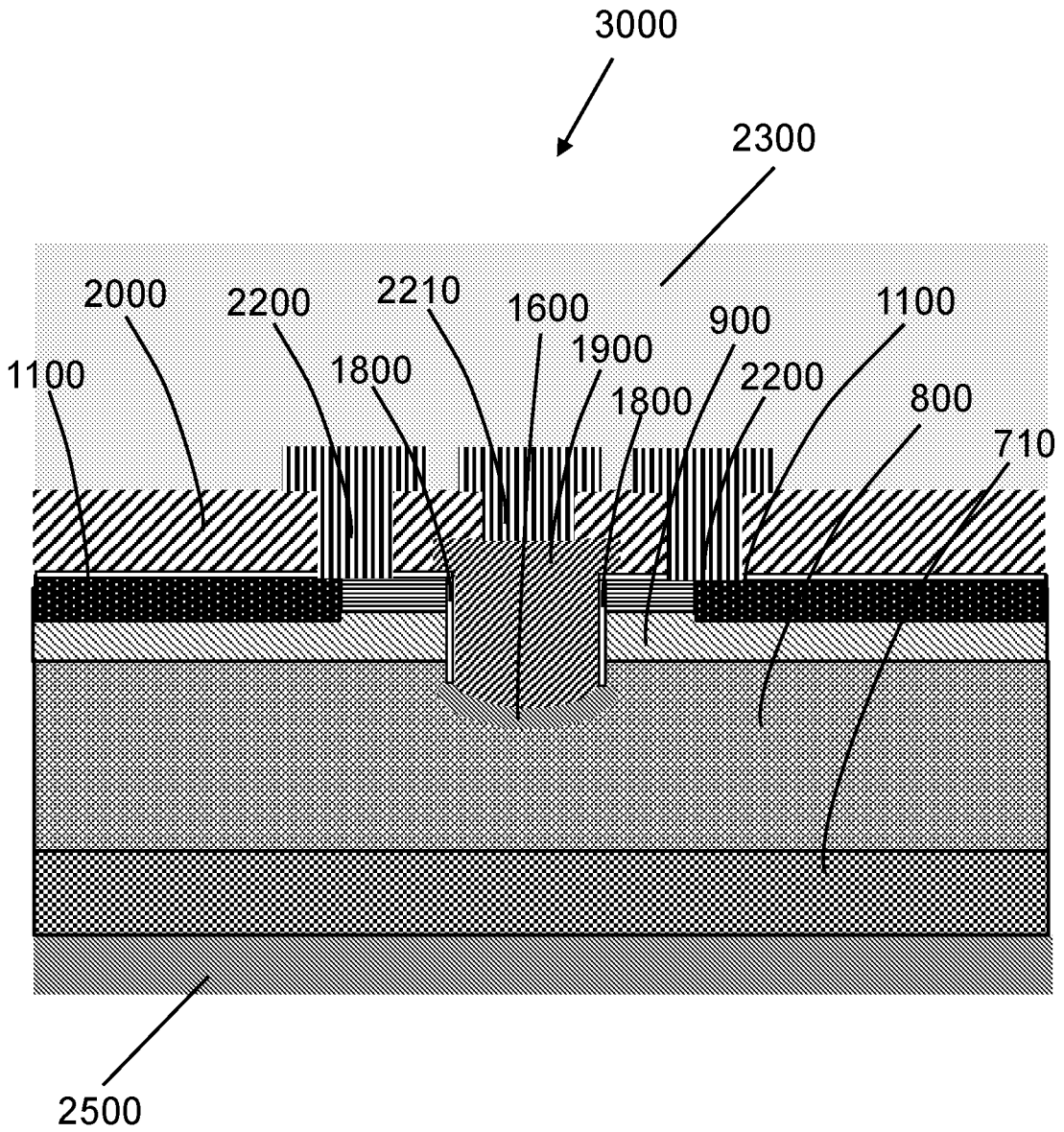
FIG. 25 is an illustration of a metal layer deposited on a surface of the epitaxial buffer layer after separation of the trench FET by exfoliation in accordance with an example embodiment.

FIG. 25 is an illustration of a metal layer 2500 deposited on a surface of epitaxial buffer layer 710 after separation of trench FET 3000 by exfoliation in accordance with an example embodiment. Metal layer 2500 is deposited on a surface 2400 of buffer epitaxial layer 710 to form a drain contact for trench FET 3000 that has been exfoliated. In one embodiment, surface 2400 of epitaxial buffer layer 710 is polished and metal layer 2500 is deposited using evaporation, sputtering, electrodeposition among other methods of metal deposition. Metals such as nickel or combination of metals such as Ti/Ni/Ag (Titanium/Nickel/Silver) may be used along with annealing to reduce contact resistance to surface of epitaxial buffer layer 710. In one embodiment, laser annealing may be used to reduce contact resistance of metal layer 2500.

Figure 26:
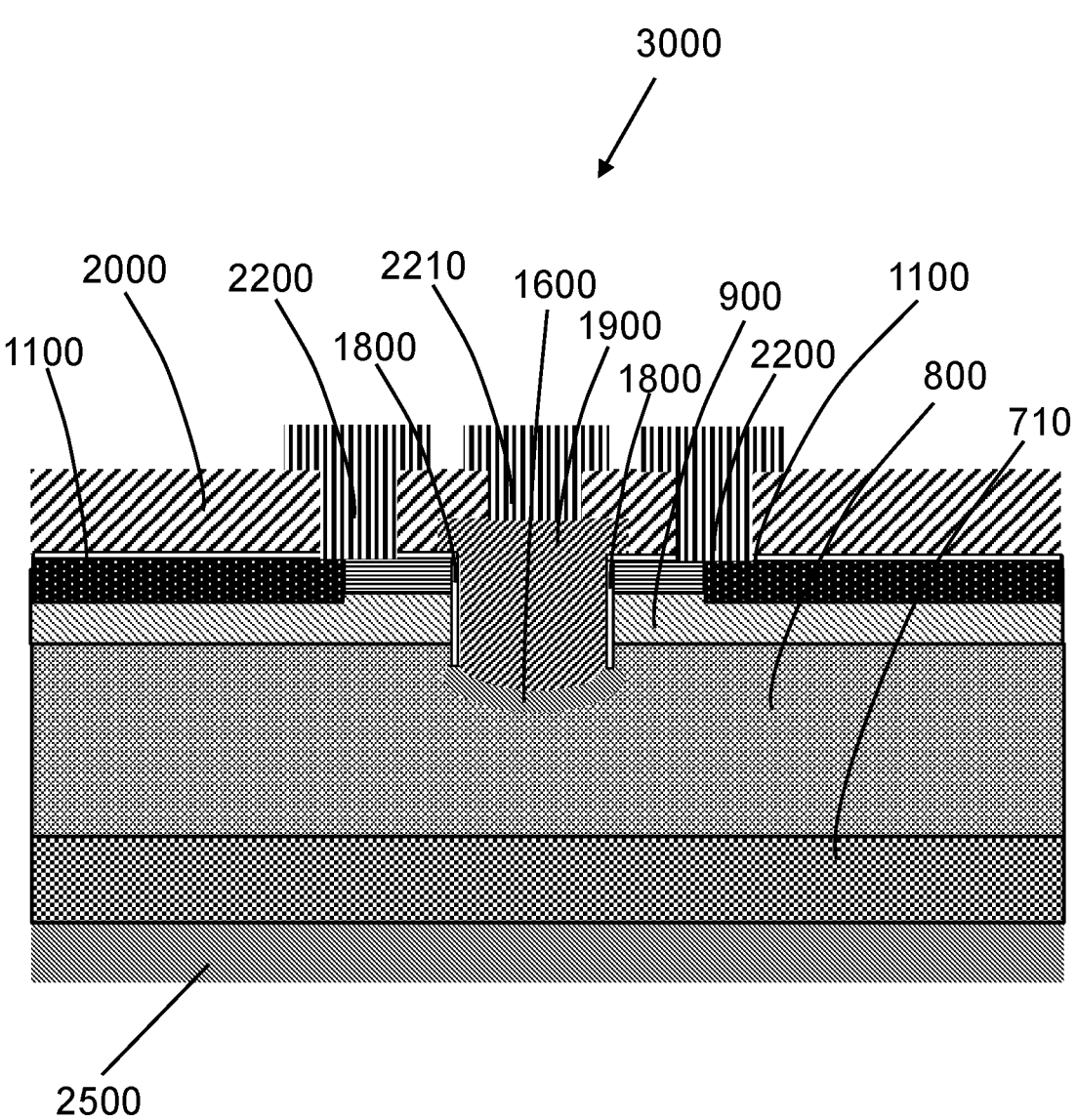
FIG. 26 is an illustration of the trench FET separated from the carrier wafer in accordance with an example embodiment.

FIG. 26 is an illustration of trench FET 3000 separated from carrier wafer 2300 of FIG. 25 in accordance with an example embodiment. In one embodiment, after metal layer 2500 is deposited, the entire assembly comprising trench FET 3000 and carrier wafer 2300 is attached to a blue dicing tape. Carrier wafer 2300 is then separated from trench FET 3000 which is coupled to the dicing tape and then diced and assembled in packages. As mentioned previously, more than one trench FET can be formed simultaneously using the semiconductor process flow described herein above on epitaxial buffer layer 710 and separated simultaneously from carrier wafer 2300 as part of this fabrication process.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

The descriptions disclosed herein below will call out components, materials, inputs, or outputs from FIGS. 1-26. in one embodiment, a trench field effect transistor (FET) 3000 comprises a substrate 100, an epitaxial buffer layer 710 overlying substrate 100, an epitaxial device layer 800 overlying epitaxial buffer layer 710, a device body layer 900 overlying epitaxial device layer 800, a trench 1300 formed through device body layer 900 into at least a portion of epitaxial device layer 800 wherein an isotropic etch is performed in trench 1300 to etch a trench bottom 1410 in epitaxial device layer 800, an oxide layer 1600 formed overlying trench bottom 1410 in epitaxial device layer 800 and a gate oxide 1800 formed on at least one wall of trench 1300 wherein gate oxide 1800 overlies oxide layer 1600.

In one embodiment, trench FET 3000 comprising substrate 100, epitaxial buffer layer 710, and epitaxial device layer 800 comprises silicon carbide. In one embodiment, trench FET 3000 comprises an isotropic etch configured to form a curved surface below the wall of trench 1300.

In one embodiment, trench FET 3000 comprises an edge of the curved surface of the trench bottom configured to improve electrical device reliability In one embodiment, trench FET 3000 comprises oxide layer 1600 configured to have a thickness in a range of 0.2 micrometers to 1.0 micrometers and is configured to reduce gate to drain capacitance of trench FET 3000.

In one embodiment, trench FET 3000 is configured such the curvature of oxide layer 1600 is configured to reduce an electric field to below the critical field to improve reliability of trench FET 3000.

In one embodiment, oxide layer 1600 of trench FET 3000 comprises oxide grown by wet oxidation and oxide grown by dry oxidation.

In one embodiment, trench FET 3000 comprises an insulating layer 1400 formed on walls of trench 1300 prior to forming gate oxide 1800. In one embodiment, insulating layer 1400 comprises silicon nitride.

In one embodiment, trench FET 3000 comprises an isotropic etch of trench 1410 bottom configured to underlie insulating layer 1400 and wherein insulating layer 1400 is configured to protect a surface of the walls of trench 1300 from the isotropic etch.

In one embodiment, trench FET 3000 comprises oxide layer 1600 configured to be formed to partially underlie insulating layer 1400

In one embodiment, insulating layer 1400 in trench FET 3000 is removed prior to forming gate oxide 1800 on at least one wall of trench 1300.

In one embodiment, trench FET 3000 comprises a majority of substrate 100 configured to be separated by exfoliation through thermal shock from epitaxial buffer layer 710.

In one embodiment, trench FET 3000 comprises a carbon layer 600 configured to be placed at or below an interface between epitaxial buffer layer 710 and substrate 100, wherein carbon layer 600 supports lateral overgrowth of epitaxial buffer layer 710 on substrate 100, and wherein carbon layer 600 is configured to be heated to exfoliate a majority of substrate 100 from epitaxial buffer layer 710 to reduce Rdson of trench FET 3000.

In one embodiment, trench FET 3000 is configured such that a minority portion of substrate 100 couples to epitaxial buffer layer 710 after exfoliation, wherein the minority portion of substrate 100 is removed from epitaxial buffer layer 710, and wherein a metal layer 2500 is deposited to a surface of epitaxial buffer layer 710.

In one embodiment, trench FET 3000 comprises a source region 1000 formed in device body layer 900; and termination regions 1100 formed in device body layer 900 adjacent to source region 1000 wherein termination region 1100 is configured to surround or partially surround source region 1000.

In one embodiment, a plurality of trench FETs 3000 are formed on substrate 100, wherein each trench FET 3000 is within a dicing grid, and wherein the plurality of trench FETs 3000 are separated from one another by fracturing substrate 100 within the dicing grid using thermal shock.

In one embodiment, trench field transistor (FET) 3000 comprises substrate 100, epitaxial buffer layer 710 formed overlying substrate 100, epitaxial device layer 800 formed overlying epitaxial buffer layer 710, device body layer 900 formed overlying epitaxial device layer 800, trench 1300 formed through device body layer 900 into at least a portion of epitaxial device layer 800 wherein the trench wall is substantially vertical, insulating layer 1400 formed on walls of trench 1300 wherein a bottom of trench 1300 is isotropically etched such that the bottom of trench 1300 has a curved surface, wherein the bottom of trench 1300 extends below insulating layer 1400 after the isotropic etch, and wherein the wall of trench 1300 is curved below insulating layer 1400, oxide layer 1600 formed overlying the trench bottom in epitaxial device layer wherein oxide layer 1600 is curved corresponding to the shape of the trench bottom, and gate oxide 1800 is formed on at least one wall of trench 1300 wherein gate oxide 1800 is formed after insulating layer 1400 is removed.

In one embodiment, trench FET 3000 comprises oxide layer 1600 configured to have a thickness in a range of 0.2 micrometers to 1.0 micrometers, wherein gate oxide 1800 overlies oxide layer 1600. In one embodiment, oxide layer 1600 comprises oxide grown by wet oxidation and oxide grown by dry oxidation.

In one embodiment, trench field effect transistor (FET) 3000 comprises substrate 100, epitaxial buffer layer 710 formed overlying substrate 100, epitaxial device layer 800 formed overlying epitaxial buffer layer 710, device body layer 900 formed overlying epitaxial device layer 800; trench 1300 formed through device body layer 900 into at least a portion of epitaxial device layer 800 wherein an isotropic etch is performed in trench 1300 to etch a trench bottom in epitaxial device layer 800, oxide layer 1600 formed overlying the trench bottom in epitaxial device layer 800; and gate oxide 1800 formed on at least one wall of the trench wherein the gate oxide overlying oxide layer 1600 wherein a majority of substrate 100 is configured to be separated by exfoliation through thermal shock from epitaxial buffer layer 710 and wherein the majority of substrate 100 is configured for subsequent use to manufacture one or devices.

What is claimed:

1. A trench field effect transistor (FET) comprising:
a substrate having a top surface and a bottom surface;
a patterned layer overlying the top surface of substrate comprising a plurality of trenches etched in a pattern, wherein the patterned layer further includes a layer comprising elemental carbon in the plurality of trenches; and
an epitaxial buffer layer formed on the plurality of trenches;
an epitaxial device layer overlying the epitaxial buffer layer;
a device body layer overlying the epitaxial device layer;
a trench formed through the device body layer into at least a portion of the epitaxial device layer wherein an isotropic etch is performed in the trench to etch a trench bottom in the epitaxial device layer;
an oxide layer overlying the trench bottom in the epitaxial device layer; and
a gate oxide on at least one wall of the trench.

2. The trench FET of claim 1 wherein the substrate, the epitaxial device layer, and the device body layer comprises silicon carbide and wherein the substrate, the epitaxial buffer layer, and the device body layer are single crystal.

3. The trench FET of claim 1 wherein the plurality of trenches forms a plurality of pillars in the patterned layer.

4. The trench FET of claim 3 wherein the layer of elemental carbon in the plurality of trenches is less a height of the plurality of pillars.

5. The trench FET of claim 4 wherein the epitaxial buffer layer is grown by epitaxial lateral overgrowth such that lateral growth of the epitaxial buffer layer extends from sidewalls of the plurality of trenches and merges to form the surface of the epitaxial buffer layer.

6. The trench FET of claim 5 wherein the epitaxial device layer is grown on the surface of the epitaxial buffer layer by epitaxy.

7. The trench FET of claim 1 wherein the substrate absorbs energy at a different wavelength than the elemental carbon.

8. The trench FET of claim 5 wherein the plurality of trenches are shaped as hexagons or triangles.

9. The trench FET of claim 6 1 wherein the isotropic etch is configured to form a curved surface below the wall of the trench.

10. The trench FET of claim 9 wherein an edge of the curved surface of the trench bottom is configured to improve electrical device reliability.

11. The trench FET of claim 10 wherein the oxide layer is configured to have a thickness in a range of 0.2 micrometers to 1.0 micrometers.

12. The trench FET of claim 11 wherein the curvature of the oxide layer is configured to reduce an electric field to below the critical field to improve reliability of the trench FET.

13. The trench FET of claim 12 wherein the oxide layer comprises oxide grown by wet oxidation and oxide grown by dry oxidation.

14. The trench FET of claim 13 wherein the gate oxide overlies the oxide layer.

15. The trench FET of claim 14 further including:
a source region formed in the device body layer;
a termination regions formed in the device body layer adjacent to the source region wherein the termination region is configured to surround or partially surround the source region.

16. The trench FET of claim 1 wherein a plurality of trench FETs are formed overlying the substrate and wherein a dicing grid surrounds each trench FET of the plurality of trench FETs.

17. A trench field effect transistor (FET) comprising:
a substrate having a top surface and a bottom surface wherein the substrate comprises one of silicon carbide, gallium nitride, gallium arsenide, or indium phosphide;
a patterned layer comprising a plurality of trenches etched in the top surface of the substrate, wherein a layer of material is in the plurality of trenches, wherein the material comprises elemental carbon, and wherein a height of the layer of material is less than a height of sidewalls of the patterned layer;
an epitaxial buffer layer on the patterned layer, wherein the epitaxial buffer layer is grown by epitaxial lateral overgrowth, wherein exposed portions of the sidewalls of the patterned layer supports lateral growth extending from the sidewalls of the patterned layer that merges to form a portion of a surface of the epitaxial buffer layer that is single crystal with the substrate, and wherein the surface of the epitaxial buffer layer overlies the layer of material in the patterned layer:
an epitaxial device layer overlying the patterned layer;
a device body layer overlying the epitaxial device layer;
a trench formed through the device body layer into at least a portion of the epitaxial device layer;
an oxide layer overlying the trench bottom in the epitaxial device layer wherein the oxide layer is curved corresponding to the shape of the trench bottom;
a gate oxide on at least one wall of the trench;
a source region in the device body layer; and
a gate electrode, a source electrode, and a drain electrode respectively coupled to the gate oxide, the source region, and the epitaxial device layer.

18. The trench FET of claim 17 wherein the plurality of trenches form a plurality of pillars and wherein at least one wavelength of light is transparent to the substrate but absorbed by the elemental carbon.

19. The trench FET of claim 18 wherein the epitaxial buffer layer supports a reduction of dislocation defects from the substrate in the epitaxial buffer layer and the device body layer.

20. A trench field effect transistor (FET) comprising:

a substrate having a top surface and a bottom surface wherein the substrate comprises one of silicon carbide, gallium nitride, gallium arsenide, or indium phosphide;

a patterned layer overlying the substrate comprising a plurality of trenches etched in the top surface of the substrate to form a plurality of pillars, a layer of elemental carbon overlying a bottom surface of the plurality of trenches wherein the elemental carbon absorbs energy at a wavelength that is transparent to the substrate;

an epitaxial buffer layer on the patterned layer, wherein a portion of a surface of the epitaxial buffer layer comprises epitaxy overlying the layer of elemental carbon that is single crystal with the substrate;

an epitaxial device layer;

a device body layer overlying the epitaxial device layer;

a trench formed through the device body layer into at least a portion of the epitaxial device layer;

an oxide layer overlying the trench bottom in the epitaxial device layer;

a source region in the device body layer;

a gate oxide on at least one wall of the trench; and a gate electrode, a source electrode, and a drain electrode respectively coupled to the gate oxide, the source region, and the epitaxial device layer.

* * * * *